(12) United States Patent
Matsuyama et al.

(10) Patent No.: US 7,226,874 B2
(45) Date of Patent: Jun. 5, 2007

(54) SUBSTRATE PROCESSING METHOD

(75) Inventors: Seiji Matsuyama, Kyoto (JP); Takuya Sugawara, Nirasaki (JP); Shigenori Ozaki, Amagasaki (JP); Toshio Nakanishi, Amagasaki (JP); Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/986,323

(22) Filed: Nov. 12, 2004

(65) Prior Publication Data

US 2005/0153570 A1    Jul. 14, 2005

Related U.S. Application Data

(63) Continuation-in-part of application No. PCT/JP03/04036, filed on Mar. 28, 2003.

(30) Foreign Application Priority Data

May 13, 2002    (JP)    ............... 2002-137326

(51) Int. Cl.
  *H01L 21/31*    (2006.01)
  *H01L 21/469*   (2006.01)
(52) U.S. Cl. .............. 438/786; 438/776; 438/777; 438/792; 257/E21.267
(58) Field of Classification Search ................ 438/775, 438/786, 798, 287, 776, 777, 792, FOR. 385, 438/FOR. 395; 257/E21.267
See application file for complete search history.

(56) References Cited

U.S. PATENT DOCUMENTS

| | | | |
|---|---|---|---|
| 5,821,168 A * | 10/1998 | Jain ............. | 438/692 |
| 6,313,047 B2 | 11/2001 | Hasebe et al. ....... | 438/785 |
| 6,548,422 B1 * | 4/2003 | Roy et al. .......... | 438/775 |
| 6,551,948 B2 * | 4/2003 | Ohmi et al. ........ | 438/778 |
| 2004/0048452 A1 | 3/2004 | Sugawara et al. ..... | 438/484 |
| 2004/0142577 A1 | 7/2004 | Sugawara et al. ..... | 438/772 |
| 2004/0235311 A1 | 11/2004 | Nakanishi et al. .... | 438/775 |
| 2004/0241968 A1 | 12/2004 | Murakawa et al. ..... | 438/513 |
| 2004/0250771 A1 | 12/2004 | Ozaki et al. ........ | 118/723 |
| 2005/0003660 A1 | 1/2005 | Murakawa et al. ..... | 438/643 |
| 2005/0005844 A1 | 1/2005 | Kitagawa et al. ..... | 118/715 |
| 2005/0153570 A1 | 7/2005 | Matsuyama et al. | |
| 2005/0164523 A1 | 7/2005 | Sugawara et al. ..... | 438/791 |
| 2005/0170543 A1 | 8/2005 | Sugawara et al. ..... | 438/38 |
| 2005/0176223 A1 | 8/2005 | Matsuyama et al. | |

FOREIGN PATENT DOCUMENTS

| | | |
|---|---|---|
| JP | 2002-151684 | 5/2002 |
| JP | 2002-343792 | 11/2002 |
| JP | 2003-142482 | 5/2003 |
| WO | WO 02/054474 | 7/2002 |
| WO | WO 03/019644 | 3/2003 |

* cited by examiner

*Primary Examiner*—George R. Fourson
*Assistant Examiner*—Julio J. Maldonado
(74) *Attorney, Agent, or Firm*—Oblon, Spivak, McClelland, Maier & Neustadt, P.C.

(57) ABSTRACT

A substrate processing method forming an oxynitride film by nitriding an oxide film formed on a silicon substrate includes a nitridation processing step that nitrides a surface of the oxide film by radicals or ions formed by exciting a nitrogen gas by microwave-excited plasma, the nitridation processing is conducted at a substrate temperature of 500° C. or less by setting an electron temperature of the microwave-excited plasma to 2 eV or less, and by setting the resident time of oxygen in the processing space in which the substrate to be processed is held, to two seconds or less.

17 Claims, 20 Drawing Sheets

SUBSTRATE PROCESSING METHOD

CROSS-REFERENCE TO RELATED APPLICATIONS

The present invention is a continuation-in-part application of PCT/JP03/04036 filed on Mar. 28, 2003 based on Japanese priority application 2002-137326 filed on May 13, 2002, the entire contents of these applications are incorporated by reference.

BACKGROUND OF THE INVENTION

The present invention generally relates to substrate processing method and more particularly to a nitridation method of an oxide film formed on a silicon substrate surface.

With progress in the art of device miniaturization, production of ultra-miniaturization semiconductor devices having the gate length of 0.1 µm or less is becoming possible these days.

In order to improve the device operational speed by way of decrease of the gate length in such ultra-miniaturization semiconductor devices, there is also a need to decrease the thickness of the gate insulation film in accordance with scaling law. Thus, in the case of using a conventional thermal oxide film as the gate insulation film, it is necessary to reduce the thickness of the gate insulation film to a thickness equal to or smaller than the conventional thickness of 1.7 nm. However, when the thickness of the oxide film is decreased like this, there arises a problem in that the gate leakage current through the oxide film is increased as a result of tunneling effect.

Because of this problem, attempts has been made to use a high dielectric film (so-called high-K dielectric film) such as $Ta_2O_5$ or $HfO_2$, $ZrO_2$, for the gate insulation film in place of the conventional silicon oxide film. However, the nature of such high dielectric film is very much different from those of the silicon oxide film used conventionally in the semiconductor technology, and there remain numerous problems to be solved before it becomes possible to use these high dielectric films as a gate insulation film.

Contrary to this, a silicon nitride film or a silicon oxynitride film is the material used with the conventional semiconductor process and is thought as being a promising material for the gate insulation film of high-speed semiconductor devices of the next generation, in view of the specific dielectric constant thereof of 1.5–2 times as large as that of a silicon oxide film.

Conventionally, a silicon nitride film has generally been formed by a plasma CVD process on an interlayer insulation film. However, such a CVD nitride film generally contains a large number of defects and is characterized by large leakage current. Thus, a CVD nitride film is not suitable for a gate insulation film. In fact, there has been no attempt made to use a nitride film for a gate electrode.

On the other hand, there has been proposed a technology recently that converts the surface of a silicon oxide film into an oxynitride film by N radicals or NH radicals generated by introducing a gas containing nitrogen such as a nitrogen gas, or nitrogen and hydrogen gases or an $NH_3$ gas, into rare gas plasma such as microwave-excited Ar or Kr plasma; The oxynitride film thus formed provides a small thermal oxide-film equivalent film thickness and a leakage current characteristic that surpasses a thermal oxide film. Thus, it is thought that such a film is a promising material for the gate insulation film of the next generation high-speed semiconductor devices. The oxynitride film thus formed is also chemically stable and can suppress, in the case a high-dielectric film is formed on the oxynitride film, the diffusion of metallic elements in the high dielectric film through the oxynitride film, and thus, the reaction between the high-dielectric film and the silicon substrate caused by such diffusion. Further, there is also proposed a technology of directly nitriding the surface of a silicon substrate by such microwave plasma.

Meanwhile, it has been known conventionally that nitrogen can be introduced into an oxide film by way of heat treatment in nitrogen ambient or by way of ion implantation of nitrogen ions. With such a method, however, it is known that the nitrogen atoms thus introduced tend to concentrate in the vicinity of the interface between the silicon substrate and the oxide film. As a result, in the case such a conventional oxynitride film is used for the gate insulation film of a MOS transistor, there arise problems such as the change of threshold voltage or deterioration of mutual conductance caused by the formation of interface states.

Because of similar reasons, there would be caused a problem also in the case of the oxynitride film formed by the N radicals or the NH radicals in that not only the desired improvement of the semiconductor device characteristics is not attained but also the degradation of the device characteristic is caused, unless the distribution of the nitrogen atoms in the film is controlled appropriately.

Further, in the case an oxynitride film is formed by nitriding an oxide film by using high-energy plasma such as inductively coupled plasma (ICP), no oxynitride film of desired property is obtained unless a plasma damage recovering process is conducted by applying an annealing process after the nitridation processing. However, such a recovery annealing process is not desirable in view of the fact that such an annealing process is an excessive process and that there may be caused further oxidation of the oxynitride film, resulting in increase of thickness of the oxynitride film.

SUMMARY OF THE INVENTION

Accordingly, it is a general object of the present invention to provide a novel and useful substrate processing method wherein the foregoing problems are eliminated.

Another and more specific object of the present invention is to provide a substrate processing method that forms an oxynitride film by microwave plasma nitridation processing of an oxide film, wherein the method is capable of suppressing segregation of the nitrogen atoms thus introduced to the interface between the silicon substrate and the oxynitride film, capable of suppressing regrowth of the oxide film at the foregoing interface and that there is no need of carrying out recovery annealing processing after the nitridation processing.

Another object of the present invention is to provide a substrate processing method for forming an oxynitride film by nitriding an oxide film formed on a surface of a silicon substrate, comprising the step of:

nitriding said oxide film by radicals or ions formed by excitation of a nitrogen gas by microwave-excited plasma, wherein said nitriding processing is carried out at a substrate temperature of less than 500° C. while setting an electron temperature of said microwave-excited plasma to 2 eV or less, and further by setting a resident time of oxygen in a processing space, in which said silicon substrate is held, to be 2 seconds or less.

According to the present invention, it becomes possible to suppress the damaging of the oxynitride film by setting the electron temperature of the microwave plasma to be 2 eV or less, preferably 1 eV or less, more preferably 0.9 eV or less. Further, by setting the resident time of oxygen in the process space to be 2 seconds or less, preferably 1 second or less, more preferably 0.86 seconds or less, the oxygen atoms decoupled as a result of nitridation of the oxynitride film are removed promptly from the processing space, and regrowth of oxide film right underneath the oxynitride film by the foregoing decoupled oxygen is suppressed. Further, by carrying out the nitridation processing at the temperature of less than 500° C., the problem of the nitrogen atoms thus introduced cause diffusion to the interface to the silicon substrate and cause formation of defects such as interface states is suppressed. Further, with such a nitridation processing, it should be noted that there is no need of carrying out recovering annealing processing after the nitridation processing.

Other objects and further features of the present invention will become apparent from the following detailed description of the present invention when read in conjunction with the attached drawings.

DETAILED DESCRIPTION OF THE PREFERRED EMBODIMENT

[First Embodiment]

Figure 1:
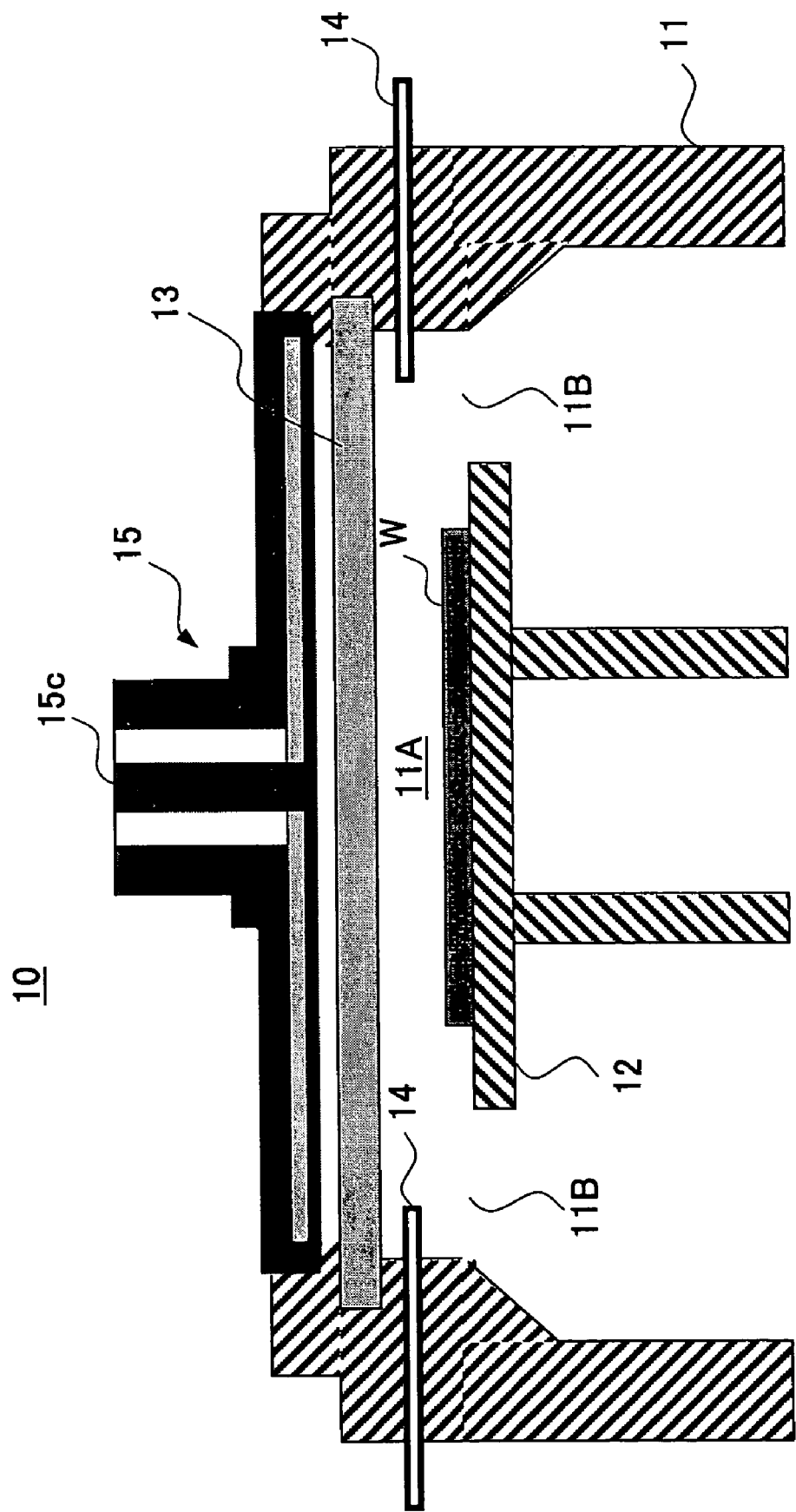
FIG. 1 is a diagram showing the construction of a microwave plasma processing apparatus used with the present invention.

FIG. 1 shows the schematic construction of a plasma substrate processing apparatus 10 used with the present invention.

Referring to FIG. 1, the plasma substrate processing apparatus 10 includes a processing vessel 11 defining a processing space 11A evacuated through an evacuation port 11B, wherein the processing space 11A is provided with a stage 12 that supports a substrate W to be processed thereon. In the plasma processing apparatus 10 used with the present invention, the processing space 11A has a volume of 24 litters, for example.

On the processing vessel 11, there is formed an opening in correspondence to the substrate W to be processed on the stage 12, and the opening is closed with a cover plate 13 of a low-loss dielectric such as quartz or alumina. Further, there are provided plural gas inlet ports 14 underneath the cover plate 13 in an axially symmetric relationship with regard to the substrate W to be processed.

Thereby, it should be noted that the cover plate 13 forms a microwave window, and a microwave antenna 15, such as a radial line slot antenna or a horn antenna, is provided at the outer side of the cover plate 13.

In operation, the processing space 11A inside the processing vessel 11 is set to a predetermined processing pressure by evacuating through the evacuation port, and an oxidizing gas or a nitriding gas is introduced from the gas inlet port 14 together with an inert gas (noble gas) such as Ar, Kr, Xe, Ne or He.

Further, a microwave of several GHz in frequency is introduced from the antenna 15, and high-density microwave plasma is excited in the processing vessel 11 at the surface of the substrate W to be processed. As a result of the microwave excitation of the plasma, the plasma is formed with low electron temperature in the substrate processing apparatus of FIG. 1, and damaging can be avoided at the substrate W to be processed or at the inner wall of the processing vessel 11. Further, the radicals thus formed are caused to flow along the surface of the substrate W to be processed in the radical direction and are evacuated promptly. Thereby, recombination of the radicals is suppressed, and it becomes possible to achieve an efficient and highly uniform substrate processing at a low temperature of 500° C. or less.

Figure 2A:
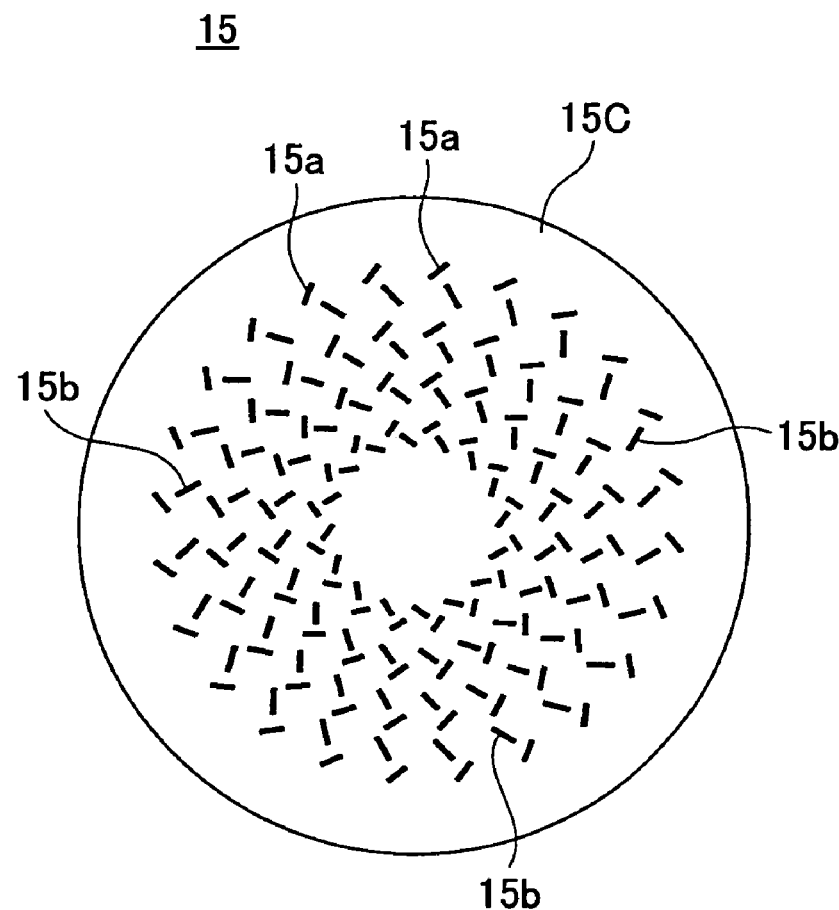
FIGS. 2A and 2B are diagrams showing the construction of a radial line slot antenna used with the microwave plasma processing apparatus of FIG. 1.
Figure 2B:
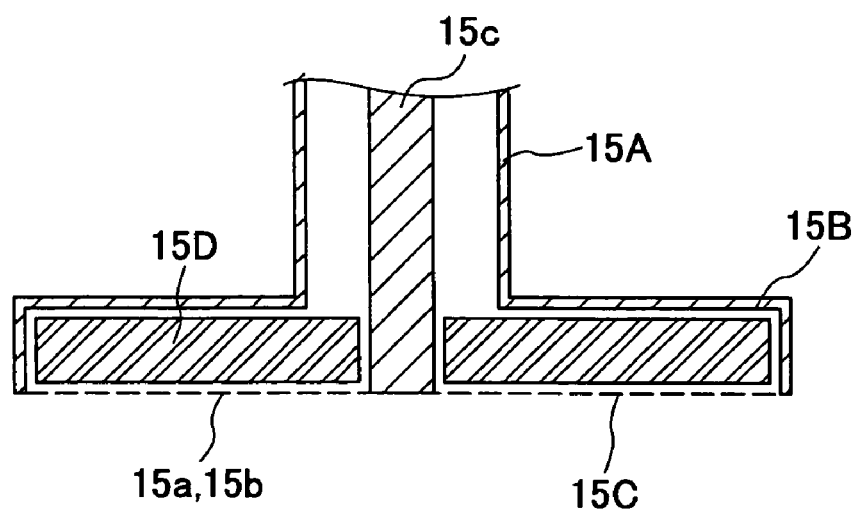

FIGS. 2A and 2B show the schematic construction of the microwave antenna 15 configured as a radial line slot antenna, wherein it should be noted that FIG. 2A is a plan view showing the radiation plane of the radial line slot antenna 15, while FIG. 2B is a cross-sectional diagram of the radial line slot antenna 15.

Referring to the cross-sectional diagram of FIG. 2B, the radial line slot antenna 15 comprises a flat, plane shaped antenna body 15B connected to an outer waveguide tube of a coaxial waveguide 15A having a central conductor 15c and a radiation plate 15C formed at the opening of the antenna body 15B, wherein the radiation plate 15C is formed with a large number of slots 15a and slots 15b that are perpendicular to the slots 15a. Thereby, the central conductor 15c of the coaxial waveguide 15A is connected to the radiation plate 15C. Further, a retardation plate 15D of a dielectric film of constant thickness is interposed between the antenna body 15B and the radiation plate 15C.

With the radial line slot antenna 15 of such a construction, the microwave fed from the coaxial waveguide 15A spreads in the radial direction between the plane shaped antenna body 15B and the radiation plate 15C, wherein the microwave experiences compression of the wavelength as a result of the function of the retardation plate 15D formed of a dielectric material.

Thus, by forming the slots 15a and 15b in a concentric relationship in correspondence to the wavelength of the microwave traveling in the radial direction and in mutually perpendicular relationship, it becomes possible to emit a plane wave collectively having a circular polarization in the direction substantially perpendicular to the radiation plate 15C.

Figure 3:
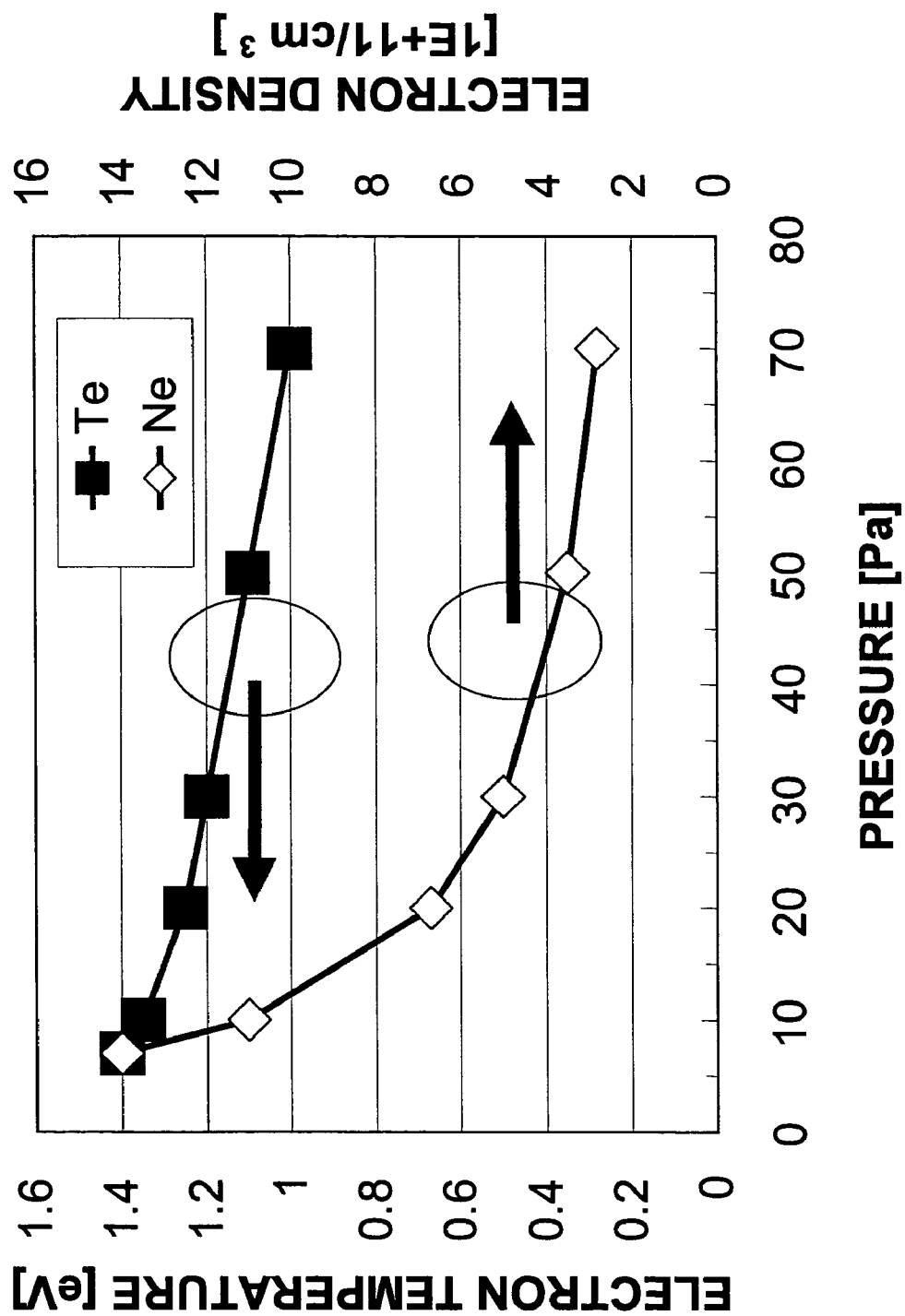
FIG. 3 is a diagram showing the electron temperature distribution and electron density distribution caused in the microwave plasma processing apparatus of FIG. 1.

FIG. 3 shows the relationship between the processing pressure and the electron temperature in the plasma substrate processing apparatus 10 of FIG. 1, wherein it should be noted that the relationship of FIG. 3 is for the case in which an Ar gas and a nitrogen gas are supplied to the processing space 11A in the processing vessel 11 and a microwave of 2.45 GHz in frequency is supplied to the processing space 11A from the radial line slot antenna 15 with a power density of 1.1–1.7 W/cm$^2$.

Referring to FIG. 3, it will be noted that there is realized a very low electron temperature of 1.4 eV or less in the processing space 11A and that the electron temperature decreases with the processing pressure. For example, in the processing pressure of 70 Pa or more, it will be noted that the electron temperature decreased to the value of 1 eV or less.

Further, from FIG. 3, it will be noted that a very high electron density of $1 \times 10^{11}$–$1 \times 10^{12}$ cm$^{-3}$ is realized in the processing space 11A. In the case the processing pressure is set to 7 Pa in particular, it can be seen that an electrons density of $1.4 \times 10^{12}$ cm$^{-3}$ is realized. Although the electrons density decreases with the processing pressure, it will be understood that an electrons density of almost $3 \times 10^{11}$ cm$^{-3}$ is secured even in the processing pressure of 70 Pa or more.

Figure 4A:
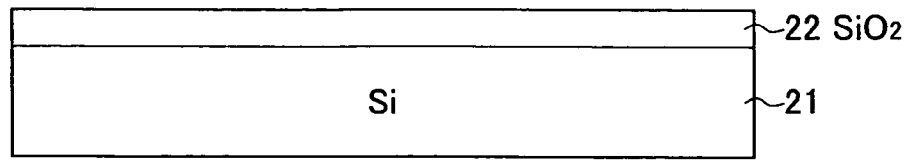
FIGS. 4A–4C are diagrams showing the substrate processing steps according to a first embodiment of the present invention.
Figure 4B:
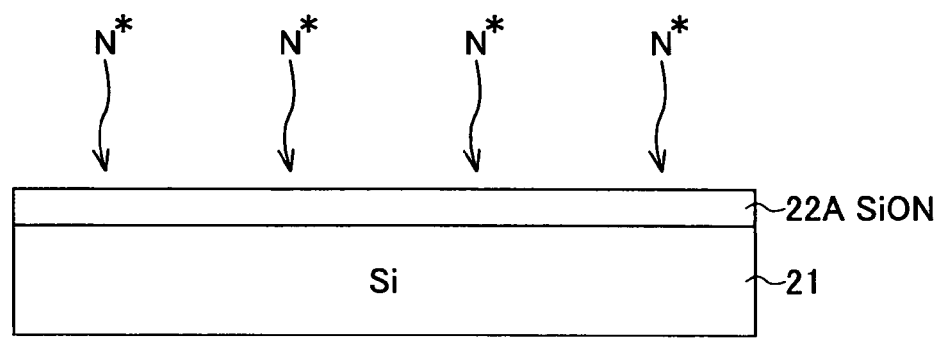
Figure 4C:
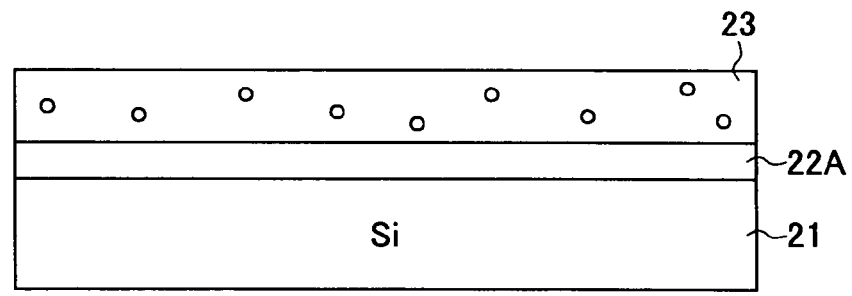

FIGS. 4A–4C show the substrate processing according to an embodiment of the present invention conducted by using the substrate processing apparatus 10 of FIG. 1.

Referring to FIG. 4A, the silicon substrate 21 is first subjected to an RCA cleaning process (SPM:$H_2SO_4$+$H_2O_2$+$H_2O$→DHF:HF+$H_2O$→SC-1:$NH_4OH$+$H_2O_2$+$H_2O$→SC-2:HCl+$H_2O_2$+$H_2O$), and is then introduced into the processing vessel 11 of the substrate processing apparatus 10 as the foregoing substrate W to be processed. Further, a mixed gas of Kr and oxygen is introduced through the gas inlet port 14, and atomic state oxygen O* is formed by exciting the gas thus introduced with the microwave of the frequency of 2.45 GHz. Thus, by processing the surface of the silicon substrate 21 with the atomic state oxygen O*, a silicon oxide film (base oxide film) 22 is formed on the surface of the silicon substrate 21 with the thickness of about 1.6 nm as shown in FIG. 4A. It should be noted that the silicon oxide film 22 thus formed has a leakage current characteristics comparable with those of the thermal oxide film formed at a high temperature of 1000° C. or more, in spite of the fact that the film formation has been made at a very low substrate temperature of about 400° C. Alternatively, the silicon oxide film 22 may be a thermal oxide film or a chemical oxide film formed by a wet processing.

Next, in the step of FIG. 4B, a mixed gas of Ar and nitrogen is supplied into the processing vessel 11w in the substrate processing apparatus 10 of FIG. 1 and plasma is excited by supplying a microwave while setting the substrate temperature to about 400° C.

In the step of FIG. 4B, the internal pressure of the processing vessel 11 is set to the range of 7–130 Pa, and the plasma processing is conducted for the duration of 10–40 seconds while supplying the Ar gas with the flow rate of 200–2000 SCCM and the nitrogen gas with the flow rate of 8–150 SCCM. As a result, the surface of the silicon oxide film 22 undergoes nitridation and is converted to a silicon oxynitride film 22A.

Next, in FIG. 4C, a polysilicon electrode 23 is formed on the silicon oxynitride film 22A thus formed. Thus, in FIG. 4C, there is obtained a MOS capacitor in which the silicon oxynitride film 22A is sandwiched between the silicon substrate 21 and the polysilicon electrode 23.

Figure 5:
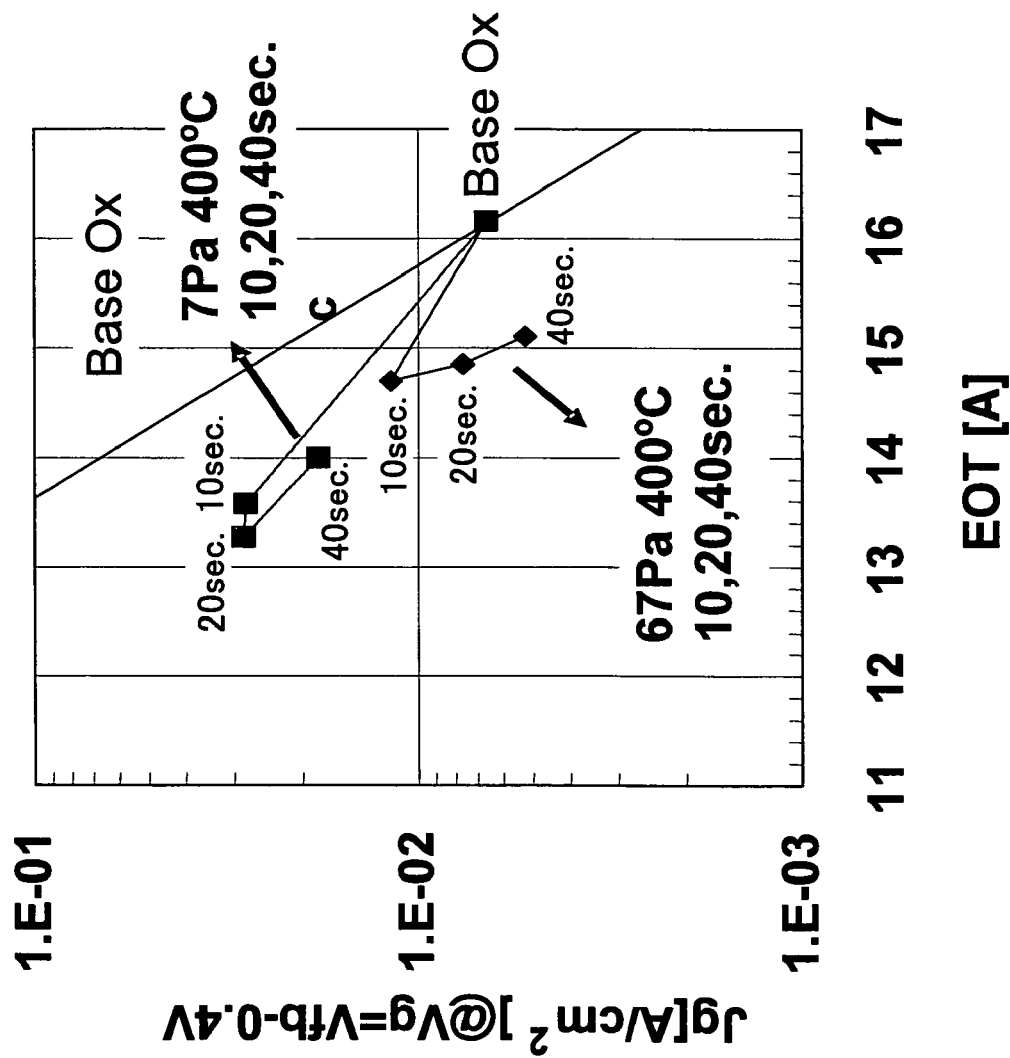
FIG. 5 is a diagram showing the relationship between an oxide-film equivalent thickness and leakage current for the oxynitride films obtained with the first embodiment of the present invention under various processing pressures.
Figure 6:
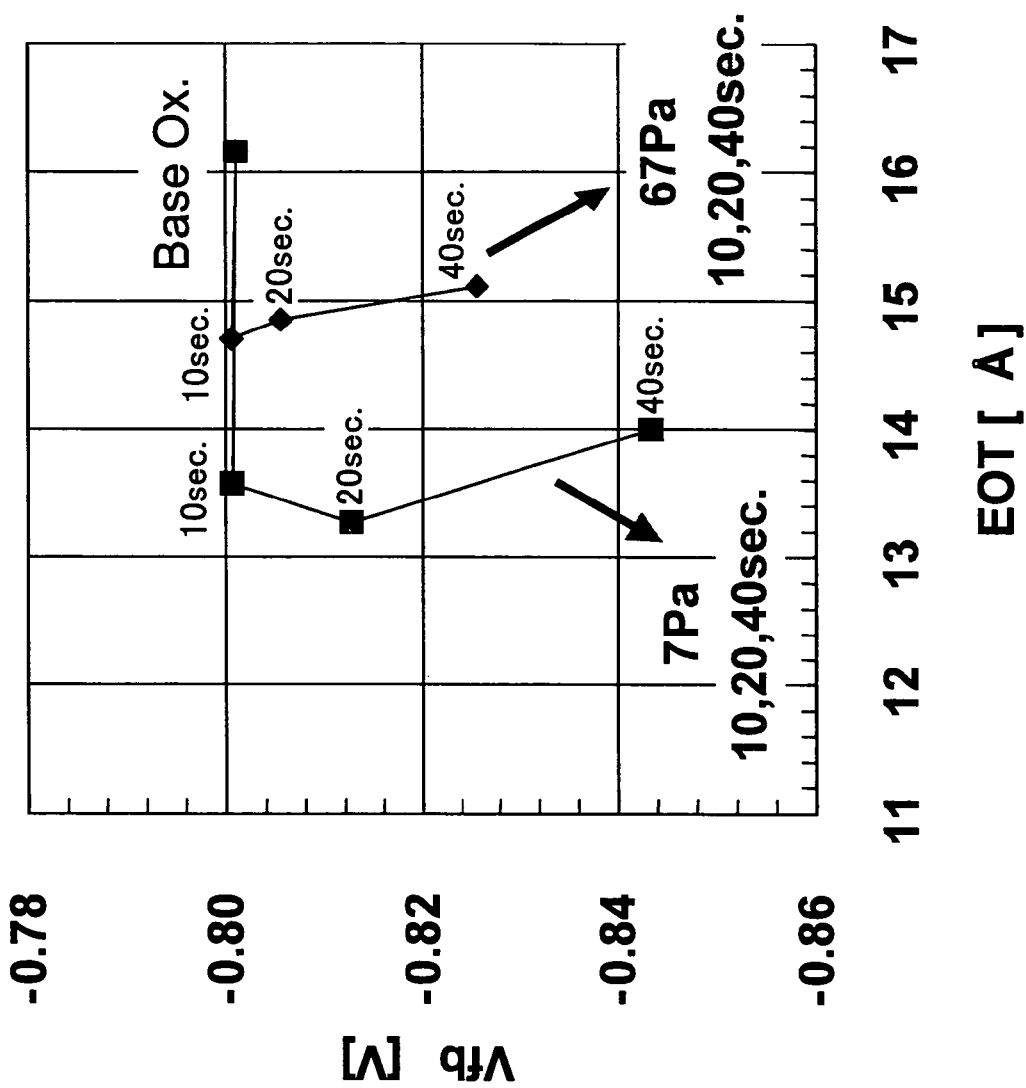
FIG. 6 is a diagram showing the relationship between the oxide-film equivalent thickness and flat-band voltage for the oxynitride films obtained with the first embodiment of the present invention under various processing pressures.

FIGS. 5 and 6 shows the relationship between the oxide-film equivalent thickness EOT and the leakage current density obtained for the oxynitride film 22A thus formed and the relationship between the oxide-film equivalent thickness EOT and the flat band voltage Vfb. Further, FIG. 5 shows the leakage current characteristics of the base oxide film 22 for the sake of comparison. In FIGS. 5 and 6, it should be noted that the nitridation processing of FIG. 4B is conducted at the substrate temperature of 400° C. while setting the flow rate of the Ar gas to 1000 SCCM, the flow rate of the nitrogen gas to 40 SCCM, and further by supplying the microwave of the frequency of 2.45 GHz from the radial line slot antenna 15 with the power density of 1.1 W/cm$^2$. Further, it should be noted that the experiments of FIGS. 5 and 6 is conducted by setting the processing pressure to 7 Pa and 67 Pa.

Referring to FIG. 5, it will be noted that there appears a tendency, in the event the nitridation processing of FIG. 4B is conducted under the processing pressure of 7 Pa, in that the oxide-film equivalent thickness EOT of the oxynitride film 22A decreases with the nitridation processing time within the duration of 10 seconds for the nitridation processing, while this tendency changes slightly in the interval in which the nitridation processing has exceeded 10 seconds but not exceeding 20 seconds. Further, when the duration of the nitridation has exceeded 20 seconds, the tendency changes to the direction in which the oxide-film equivalent thickness EOT increases with the duration of the nitridation processing.

Thereby, it will be noted that the magnitude of decrease of the oxide-film equivalent thickness is larger in the case the nitridation processing is conducted at the processing pressure of 7 Pa than in the case in which the nitridation processing is conducted at the pressure of 67 Pa.

Now, with reference to FIG. 6, it will be noted that the flat band voltage Vfb for the structure of FIG. 4C does not change substantially as long as the duration of the nitridation processing does not exceed 10 seconds in any of the cases in which the nitridation processing is conducted at 7 Pa and the nitridation processing is conducted at 67 Pa, while when the duration of the nitridation processing has exceeded 10 seconds, it will be noted that there occurs a rapid decrease of the flat band voltage Vfb.

The relationship of FIGS. 5 and 6 indicates that, in the nitridation processing conducted in the substrate processing apparatus 10 of FIG. 1 under the foregoing condition, there occurred some change in the oxynitride film 22A at the moment when the duration of the nitridation processing has exceeded 10 seconds.

Figure 7:
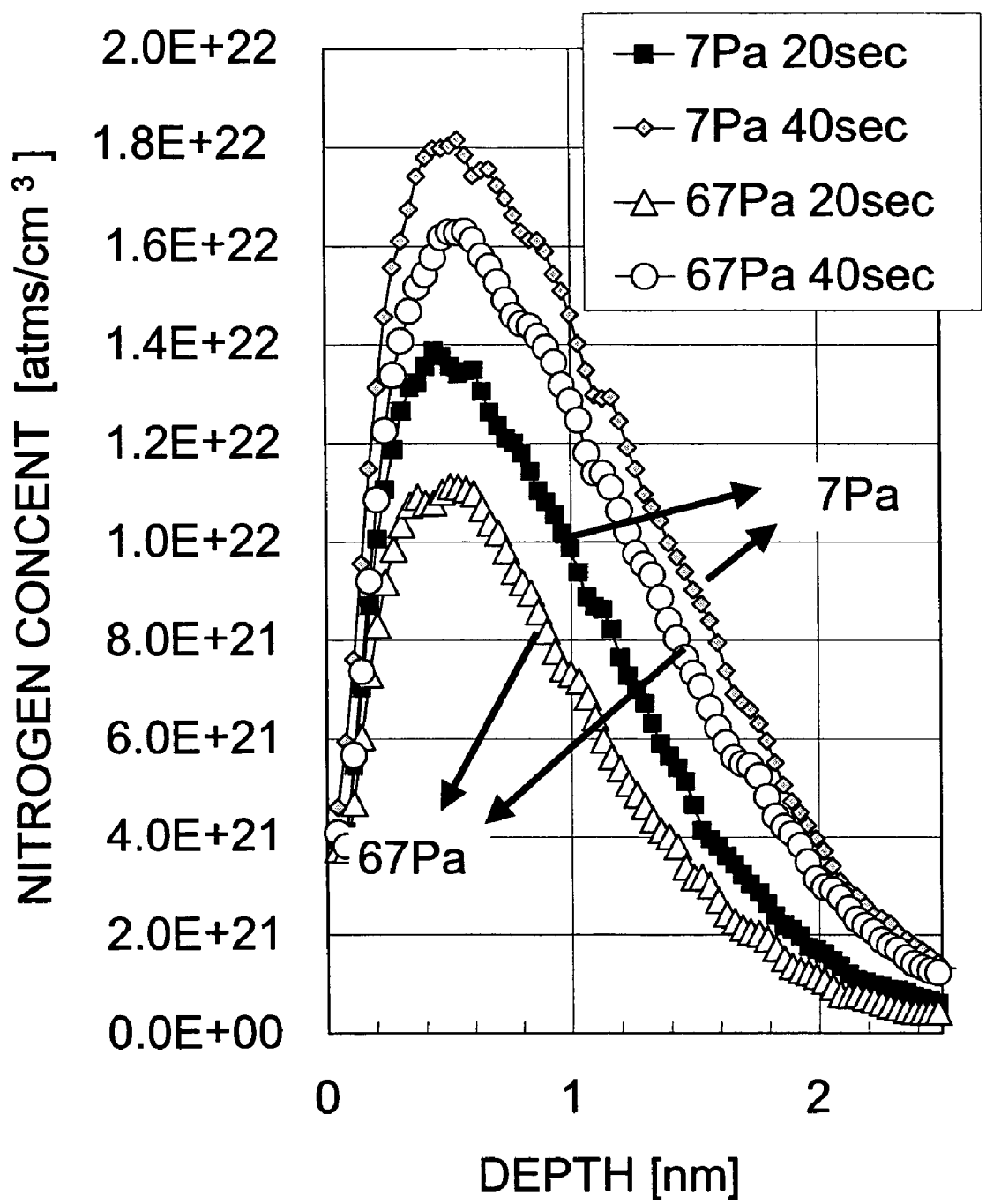
FIG. 7 is a diagram showing the depth profile of the nitrogen atoms in the oxynitride films obtained with the first embodiment of the present invention under various processing pressures.
Figure 8:
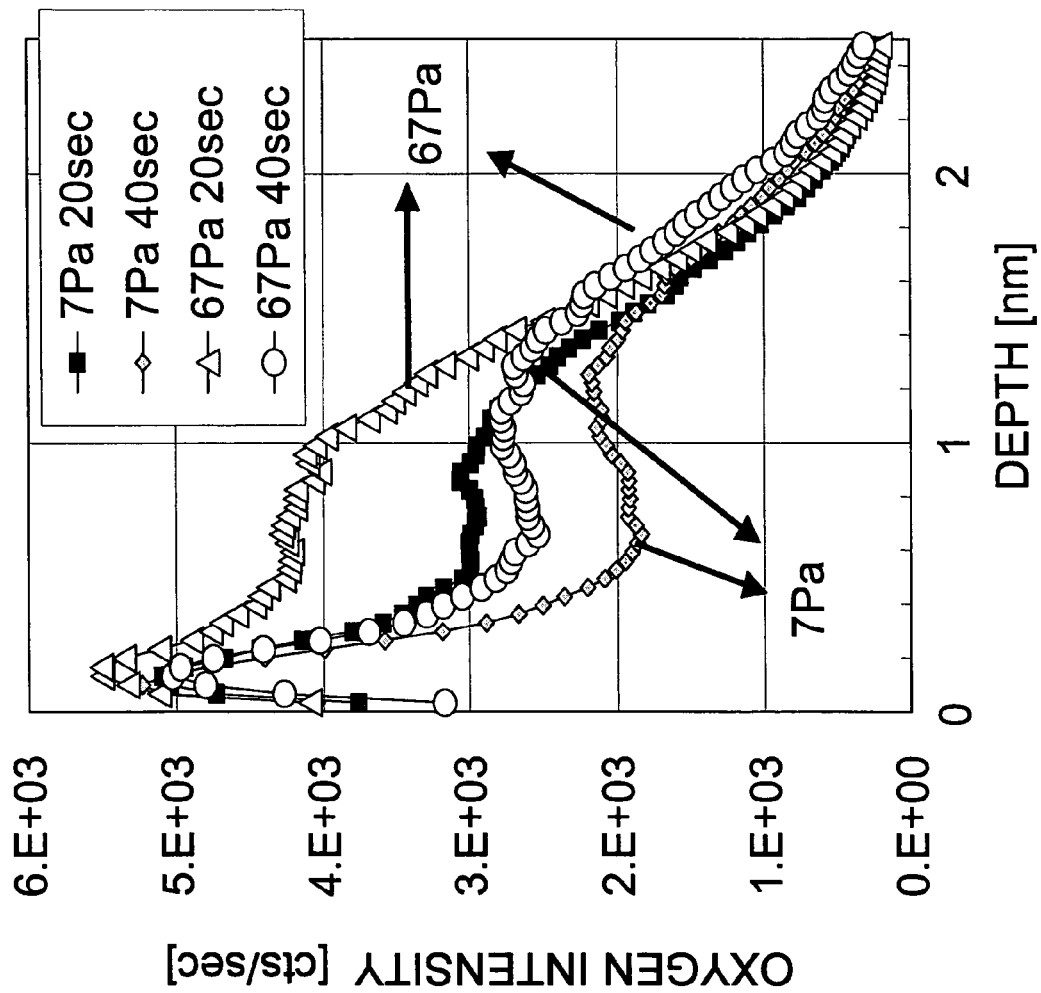
FIG. 8 is a diagram showing the depth profile of the oxygen atoms in the oxynitride films obtained with the second embodiment of the present invention under various processing pressures.

FIG. 7 shows the depth profile of the nitrogen atoms in the oxynitride film 22A thus formed, while FIG. 8 shows the depth profile of the oxygen atoms n the oxynitride film 22A, wherein ■ shows the case in which the nitridation processing of FIG. 4B is conducted for 20 seconds under the processing pressure of 7 Pa, ◇ shows the case in which the foregoing nitridation processing is conducted for 40 seconds under the same processing pressure of 7 Pa. Further, △ shows the case in which the nitridation processing of FIG. 4B is conducted for 20 seconds under the processing pressure of 67 Pa, while ○ shows the case in which the same nitridation processing is conducted for 40 seconds under the processing pressure of 67 Pa.

Referring to FIG. 7, it will be noted that the nitrogen atoms are distributed in any of these cases with a profile characterized by a peak slightly offset toward the surface of the oxynitride film having the thickness of about 1.6 nm. Further, it will be noted that there is caused no concentration of the nitrogen atoms at the interface between the oxide film and the silicon substrate, contrary to the case of conventional thermal nitridation or plasma nitridation of an oxide film. Further, from FIG. 7, it can be seen that the concentration of the nitrogen atoms introduced into the film 22A is increased when the duration of the nitridation processing is increased. On the other hand, FIG. 7 also shows that the concentration of the nitrogen atoms introduced into the film is increased when the processing pressure in the nitridation processing of FIG. 4B is reduced.

On the other hand, FIG. 8 shows the decrease of the oxygen concentration in the oxynitride film 22A with the progress of the nitridation processing, wherein it will be noted that, at the same processing pressure, the oxygen concentration in the region deeper than 1.6 nm, and hence in the region corresponding to the surface part of the silicon substrate, is increased slightly when the processing is conducted over a long time, as compared with the case in which the processing duration is short. This means that the oxygen atoms in the film 22A are migrated to the silicon substrate with the progress of the nitridation processing and there is caused a regrowth of the oxide film underneath the oxynitride film 22A. Thus, it is thought that the turn-around phenomenon shown in FIGS. 5 and 6 or the increase of the oxide-film equivalent thickness EOT of the oxynitride film 22A after a momentary decrease is caused in association with such a regrowth of the oxide film.

In FIG. 8, too, it is shown that such regrowth of the oxide film right underneath the oxynitride film 22A is effectively suppressed by conducting the nitridation processing of FIG. 4B under the relatively low pressure of 7 Pa.

Figure 9:
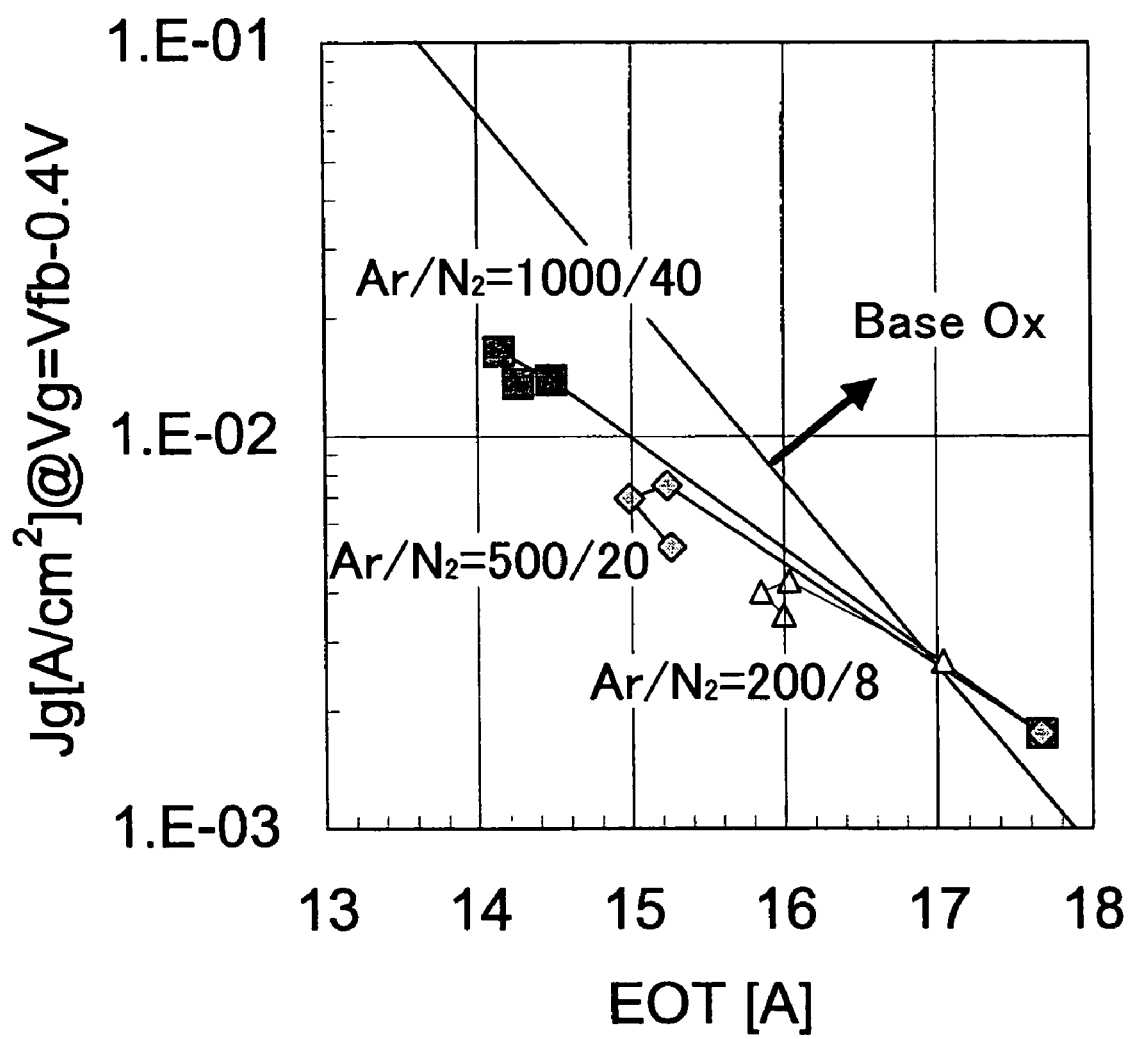
FIG. 9 is a diagram showing the relationship between the oxide-film equivalent thickness and the leakage current for the oxynitride films obtained with the first embodiment of the present invention under various gas flow rate conditions.

FIG. 9 shows the relationship between the leakage current and the oxide-film equivalent thickness EOT for the case the oxynitride film 22A is formed while changing the flow rates of the Ar gas and the nitrogen gas in the nitridation processing of FIG. 4B. In the experiment of FIG. 9, it should be noted that the substrate temperature is set to 400° C. and the processing pressure is set to 7 Pa, and the process is conducted by introducing a microwave of the frequency of 2.45 GHz into the processing space 11A from the radial line slot antenna with a power density of 1.1 W/cm$^2$. In this experiment, the ratio of the Ar gas and the nitrogen gas is fixed to 25:1.

In FIG. 9, △ shows the case the Ar gas flow rate is set to 200 SCCM and the nitrogen gas flow rate is set to 8 SCCM, while ◇ represents the case in which the Ar gas flow rate is set to 500 SCCM and the nitrogen gas flow rate is set to 20 SCCM. Further, ■ represents the case in which the Ar gas flow rate is set to 1000 SCCM and the nitrogen gas flow rate to 40 SCCM.

Referring to FIG. 9, it will be noted that the turn-around point characterized by change of tendency of the once decreased oxide-film equivalent thickness EOT to increase again, changes also by the total flow rate of the Ar gas and the nitrogen gas introduced into the processing space, and that the extent of decrease of the oxide-film equivalent thickness EOT can be reduced by increasing the foregoing total flow rate.

It is believed that the fact that the magnitude of decrease of the oxide-film equivalent thickness EOT is small in the case the total flow rate of the gas introduced into the processing space 11A is small and that the magnitude increases in the case the total flow rate is decreased in the experiments of FIG. 9 suggests, together with the fact that the magnitude of decrease of the oxide-film equivalent thickness EOT is decreased in the case the processing pressure is low and that the magnitude decreases in the case the processing pressure is high in the experiments of FIGS. 5 and 6, that the magnitude of decrease of the oxide-film equivalent thickness EOT is determined by the resident time of oxygen in the processing space 11A.

Thus, in the case the processing pressure is low, or in the case the total gas flow rate is large, the residential time of oxygen in the processing space 11A is short, and the oxygen atoms released from the oxynitride film 22A with the nitridation reaction are immediately discharged to the outside of the processing space 11A. On the other hand, in the case the processing pressure is high or the total gas flow rate is small, the residential time of oxygen in the processing space is long, and the oxygen atoms released from the oxynitride film 22A with the nitridation reaction stay in the plasma atmosphere in the processing space 11A, Thus, removal oxygen from the oxynitride film 22A to the processing space 11A is retarded, and it is believed that the excessive oxygen in the film 22A cause diffusion toward the silicon substrate 21 and cause the regrowth of the oxide film at the interface between the oxynitride film 22A and the silicon substrate 21.

Figure 10B:
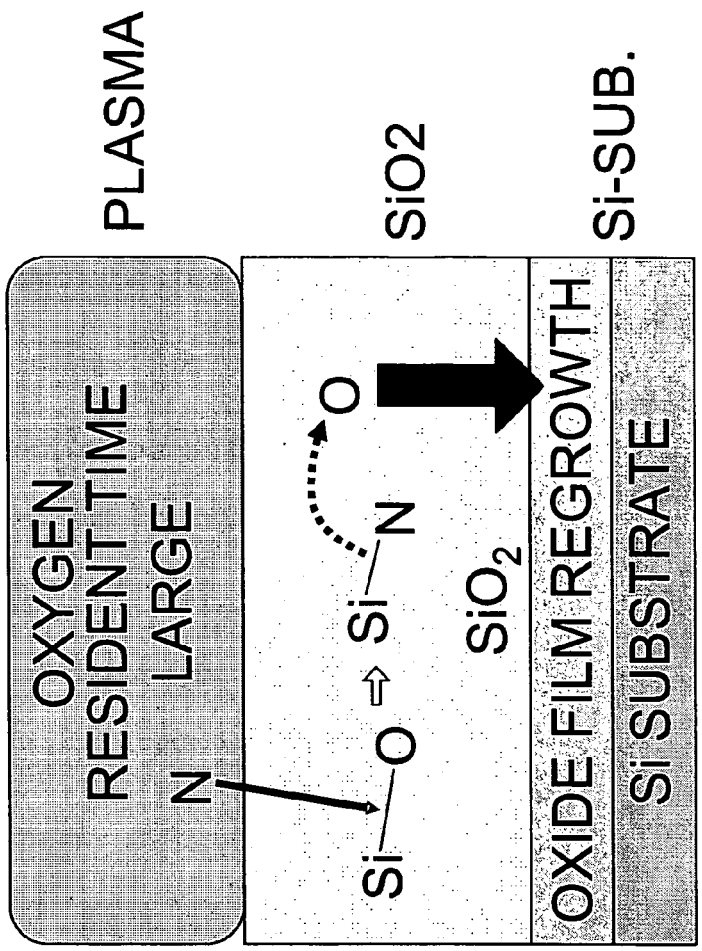
FIGS. 10A and 10B are diagrams showing the mechanism of the present invention.
Figure 10A:
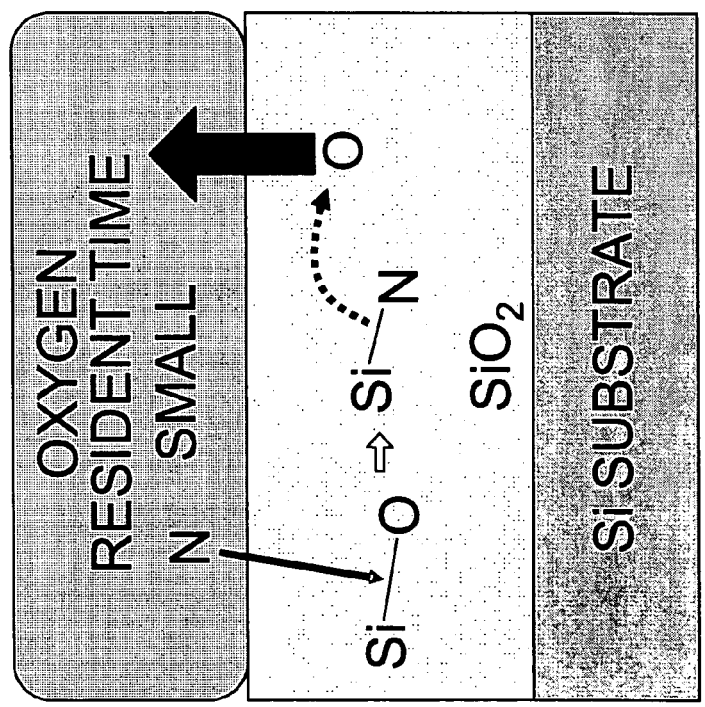

FIGS. 10A and 10B show the mechanism of plasma nitridation of an oxide film according to he present invention derived from the knowledge noted above.

Referring to FIG. 10A, in the case the resident time of oxygen in the processing space 11A, and hence in the plasma, is short, the oxygen atoms released as a result of disconnection of the Si—O bond by the nitrogen atoms are removed immediately once then reach the processing space 11A by diffusion. In the case the resident time of oxygen is long as shown in FIG. 10B, on the other hand, there exist active oxygen radicals in the plasma with high concentration, and such oxygen radicals cause the oxidation of the silicon substrate 21 when they have returned again to the oxynitride film 22A.

Figure 11A:
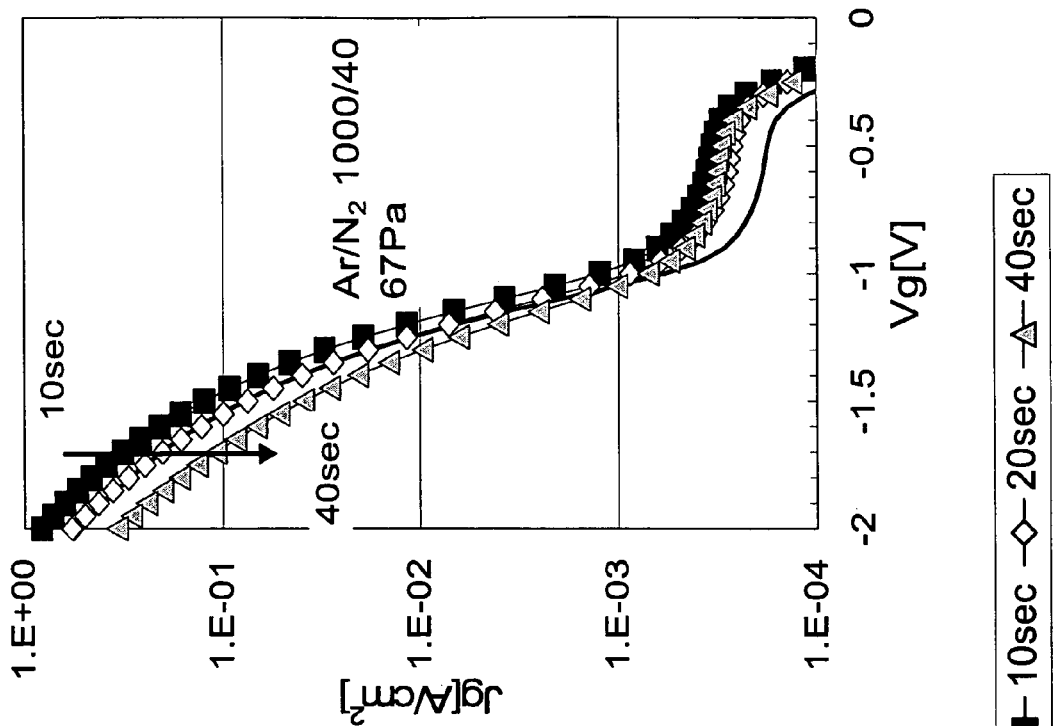
FIGS. 11A and 11B are diagrams showing the relationship between the applied voltage and the leakage current for the oxynitride films obtained with the first embodiment of the present invention under various processing pressures.
Figure 11B:
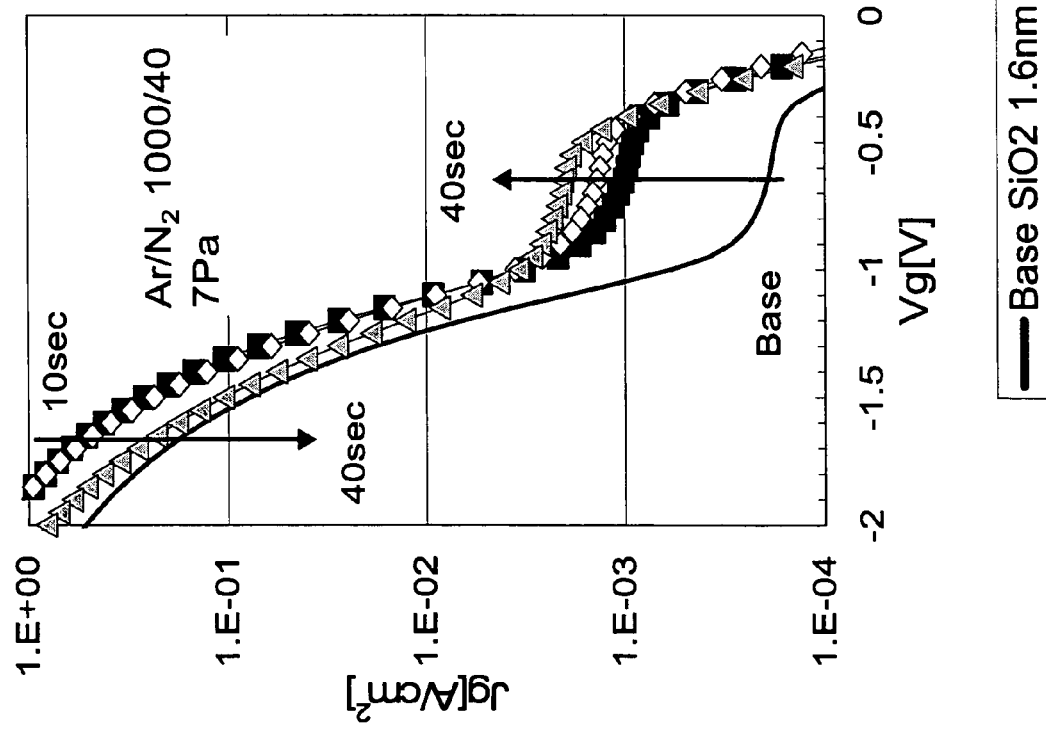

FIGS. 11A and 11B show the relationship between the applied voltage Vg and the leakage current density J for the oxynitride films 22A respectively formed by nitridation processing conducted under the processing pressure of 7 Pa and 67 Pa, wherein the continuous line represents the leakage current characteristics obtained for the oxide film 22 of FIG. 4A, ■ represents the leakage current characteristics of the oxynitride film in which the nitridation processing of FIG. 4B is conducted for 10 seconds, ◇ represents the leakage current characteristic of the oxynitride film in which the foregoing nitridation processing is conducted for 20 seconds, and Δ represents the leakage current characteristics of the oxynitride film in which the nitridation processing is conducted for 40 seconds.

Referring to FIGS. 11A and 11B, it can be seen that any of the oxynitride films shows similar leakage current characteristics in the high-bias region in which the applied voltage Vg is larger than –1V (<–1V), while in the low bias region in which the applied voltage Vg is smaller than –1V (>–1V), it can be seen that the leakage current increases as compared with the leakage current of the initial oxide film 22 by about ten times in the case the oxynitride film is formed under the processing pressure of 7 Pa. On the contrary, in the oxynitride film formed under the processing pressure of 67 Pa, there is caused little increase of the leakage current.

It is known that leakage current in small bias region is related to interface trapping or bulk trapping Ghetti, A., et al., IEDM Tech. Dig. p.731, 1999), and the result of FIGS. 11A and 11B suggests that there is caused plasma damaging in the oxynitride film thus formed under the low pressure of 7 Pa.

Figure 12:
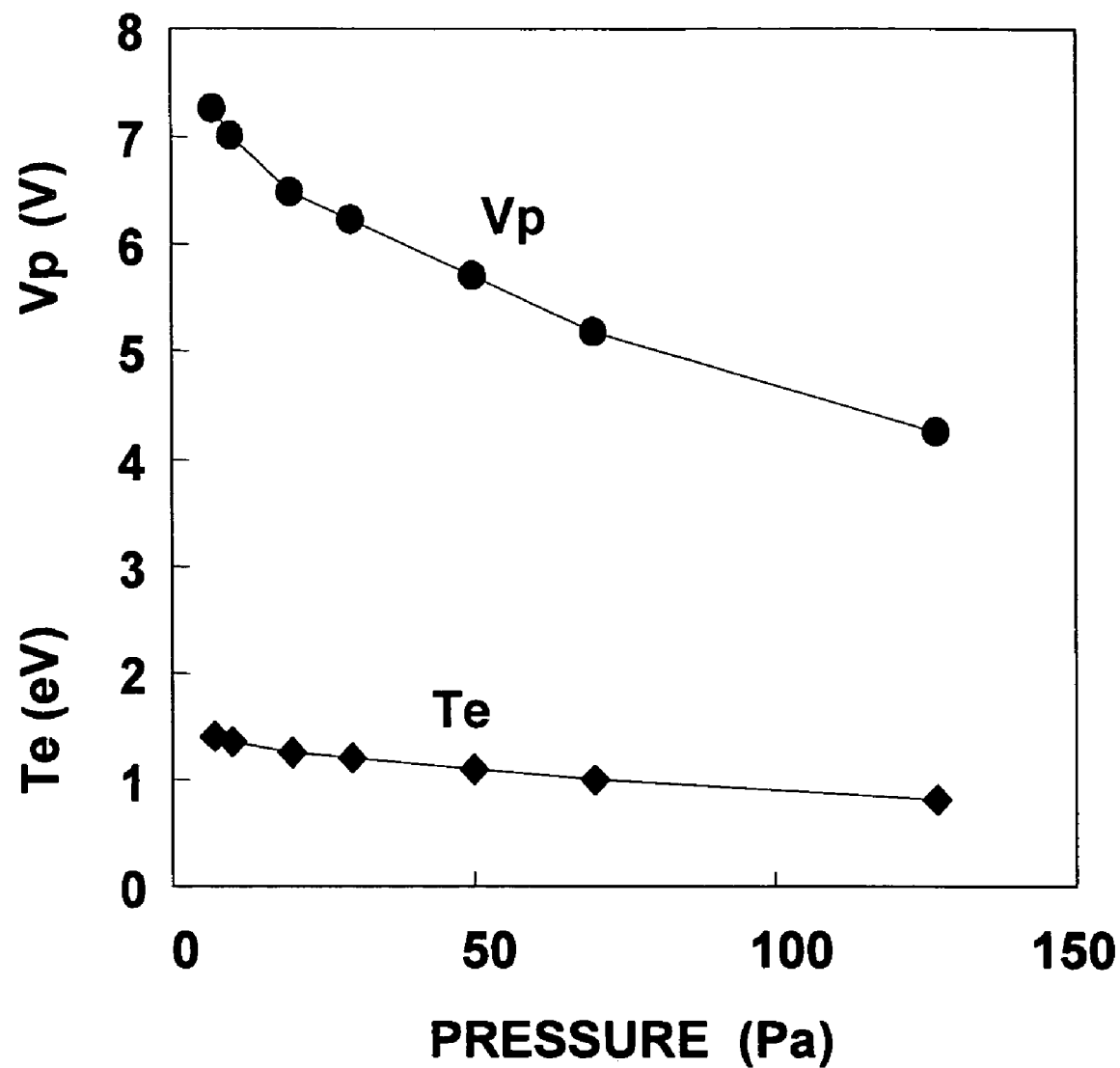
FIG. 12 is a diagram showing the ion energy distribution in the substrate processing apparatus of FIG. 1 together with the electron temperature distribution.

FIG. 12 shows the energy distribution of the ions formed in the processing space 11A of the substrate processing apparatus 10 of FIG. 1 and incident to the substrate to be processed, as a function of the processing pressure, together with the electron temperature distribution.

Referring to FIG. 12, a very low electron temperature distribution is obtained with the substrate processing apparatus 10 of FIG. 1, while it can be seen also that it is not possible to avoid formation of ions with the plasma excitation. In the processing pressure of about 7 Pa, for example, it is not possible to eliminate the incidence of ions having the energy of about 7 eV into the substrate to be processed. Further, it is believed that such ions of relatively low energy can cause certain damages in the film in the case of nitriding a very thin oxide film having the thickness of about 1 nm.

From the relationship of FIG. 12, it can be seen that the incident ion energy to the substrate is decreased also with increase of the processing pressure, similarly to the case of the electron temperature. In view of the fact that an Si—O bond has a bonding energy of 4.6 eV, it is preferable, from the relationship of FIG. 12, to increase the processing pressure to 110 Pa or more, preferably 130 Pa or more and decrease the ion energy to about 4.6 eV or less, for avoiding damages caused by ion collision. For example, in the case the processing pressure is increased to 130 Pa or more, the electron temperature is decreased to 0.9 eV or less.

On the other hand, in the case the processing pressure is increased like this, there arises a problem that a regrowth of oxide film is tend to be caused right underneath the oxynitride film 22A to be formed, as will be understood from the results of FIGS. 5 and 6 of FIGS. 7 and 8.

Thus, the present invention avoids this problem by reducing, based on the teaching of FIG. 9 and FIGS. 10A and 10B, the resident time of oxygen by increasing the gas flow rate in the processing space 10A.

More specifically, the present invention sets the processing pressure of the nitridation step of FIG. 4B to 130 Pa and supplies the Ar gas to the processing space 11A with a flow rate of 2000 SCCM and the nitrogen gas with the flow rate of 150 SCCM. With this, it becomes possible to decrease the oxide-film equivalent thickness EOT of the oxynitride film 22A thus obtained to about 1.2 nm when the nitridation processing is conducted at 400° C. for 10 seconds. In this case, the resident time of oxygen in the processing space 11A becomes 0.86 seconds (=24000/(2150*101325/130) *60). Thus, the present invention achieves decrease of oxide-film equivalent thickness of an oxynitride film by introducing a large amount of nitrogen thereto while simultaneously avoiding damaging of the oxynitride film and further suppressing the regrowth of oxide film right underneath the oxynitride film, by using a relatively high processing pressure and suppressing the resident time of oxygen in the processing space by way of increasing the gas flow rate.

In the present invention, it is also possible to set the Ar gas flow rate to 1700 SCCM and the nitrogen gas flow rate to 150 SCCM. In this case, the oxygen resident time becomes 1.0 second. Further, it is possible to set the Ar gas flow rate to 1000 SCCM and the nitrogen gas flow rate to 40 SCCM as shown in FIG. 9. In this case, the resident time of oxygen in the processing space 11A becomes 1.78 seconds.

Generally, the effect of the present invention is obtained when the resident time of oxygen is set to 2 seconds or less. Particularly, it is preferable to set the resident time to 1 second or less.

Figure 13:
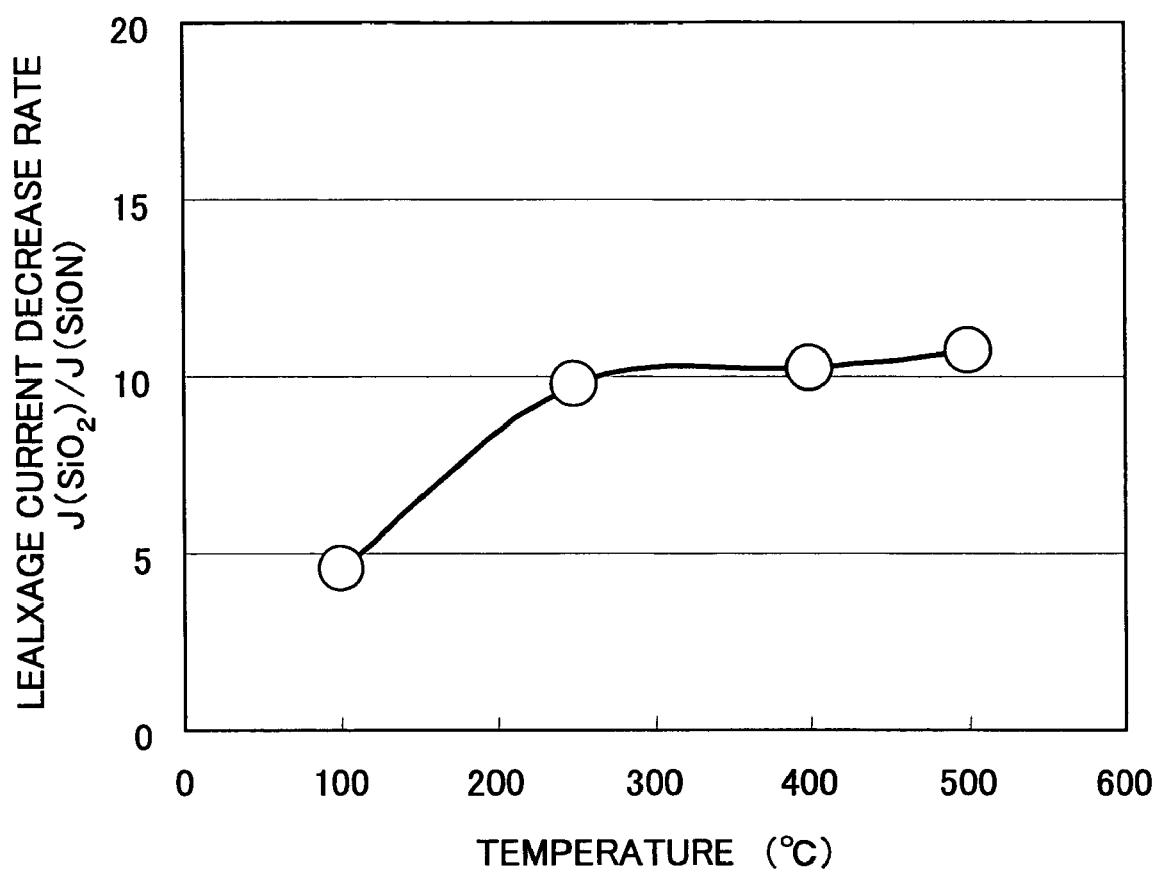
FIG. 13 is a diagram showing the relationship between the leakage current and the film-formation temperature in the oxynitride film formed with the first embodiment of the present invention.

FIG. 13 shows the leakage current characteristics of the oxynitride film 22A thus obtained for the case the temperature of the nitridation processing of FIG. 4B is changes within the range of 100–500° C. In FIG. 13, it should be noted that the vertical axis represents the rate of decrease of the leakage current density (JSiO$_2$/JSiON; J being the leakage current density).

Referring to FIG. 13, it can be seen that the rate of decrease of the leakage current is 10–11 in the case the substrate temperature is in the range of 250–500° C., while when the substrate temperature is decreased further, the value of the leakage current decrease rate is decreased also. In the case the processing is conducted at 100° C., it can be seen that the value of the rate decreases to about 5.

While the cause of this decrease of the value of the decrease rate of the leakage current at such low substrate temperature is not clear, it is probable that, in the case the substrate temperature is decreased as such, the damages, which are inevitably introduced more or less to the film, are not fully recovered.

Figure 14:
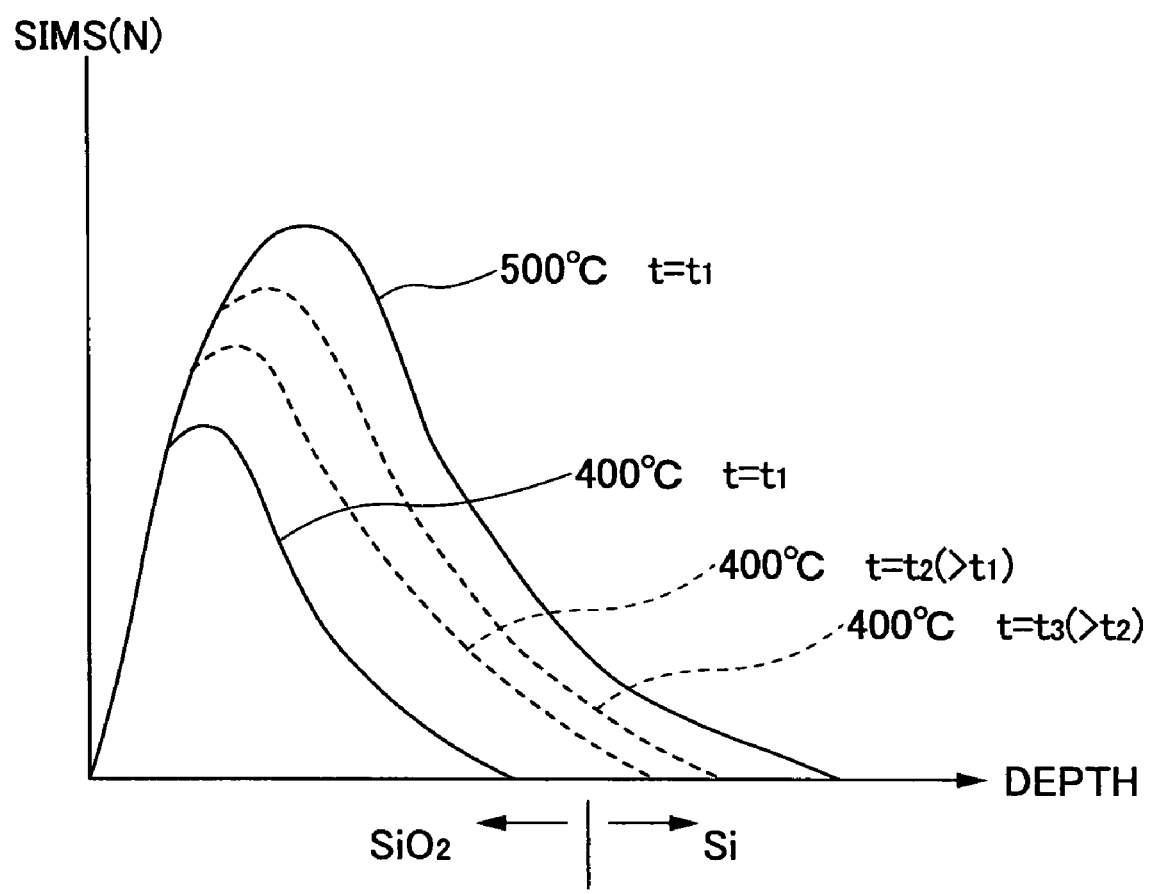
FIG. 14 is a diagram showing the diffusion of nitrogen atoms in the oxynitride film formed with the first embodiment of the present invention.

From the relationship of FIG. 13, it can will be noted that there is a possibility of decreasing the leakage current density further by using a substrate temperature higher than 500° C. However, when the substrate temperature is increased to 500° C. or more at the time of the plasma nitridation processing, there is a possibility that the nitrogen atoms introduced into the oxynitride film 22A cause diffusion to the interface between the oxynitride film 22A and the silicon substrate 21 and trapped in this part as shown in FIG. 14. Thereby, the nitrogen atoms thus trapped may form interface states. When the substrate temperature is set to 500° C. or less, such as 400° C., for example, it is possible to suppress the diffusion of the nitrogen atoms to such an interface by appropriately controlling the nitridation duration t.

From such considerations, it is concluded that the nitridation processing of the oxide film 22 of FIG. 4B is preferably conducted at the substrate temperature of 500° C. or less, particularly in the range of 250° C.–400° C.

In the explanation made heretofore, plasma nitridation of an oxide film formed on a silicon substrate has been explained for the case of conducting the plasma nitridation by using low electron temperature plasma excited by a microwave emitted from a radial line slot antenna. On the other hand, it should be noted that the present invention is applicable also to the case of nitriding an oxide film by plasma excited by other methods such as induction-coupled plasma (ICP). Thus, even in such a case, the oxygen atoms released from the oxynitride film can be removed efficiently by suppressing the resident time of oxygen to 2 seconds or less, preferably 1 second or less, by way of increasing the gas flow rate. Thereby, regrowth of oxide film right underneath the oxynitride film is suppressed.

[Second Embodiment]

Figure 15:
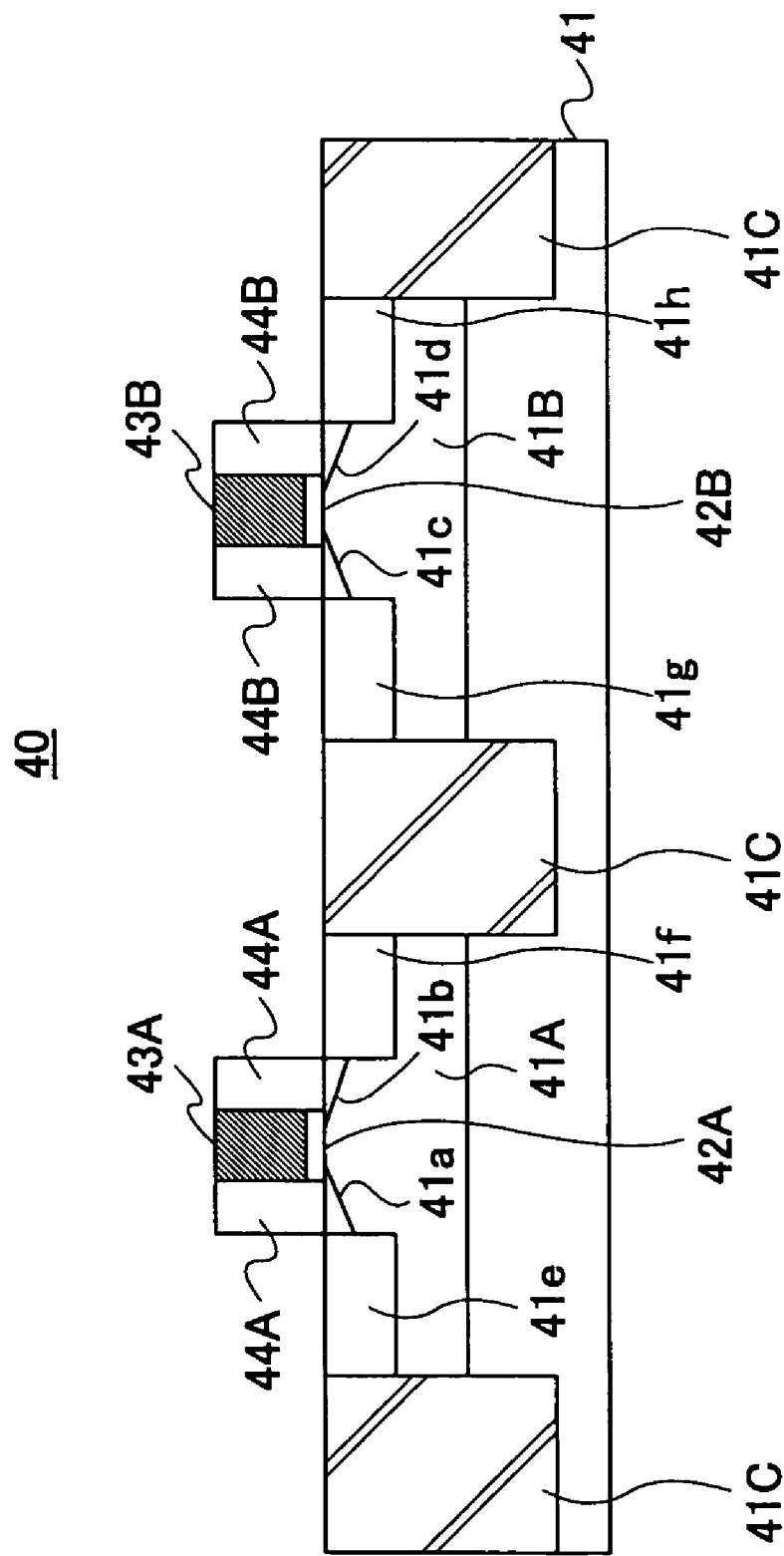
FIG. 15 is a diagram showing the construction of a CMOS device according to a second embodiment of the present invention.

FIG. 15 shows the construction of a CMOS device 40 according to a second embodiment of the present invention.

Referring to FIG. 15, the CMOS device 40 is formed on a silicon substrate 41 defined with device regions 41A and 41B by a device isolation structure 41C, wherein a p-type well is formed in the device region 41A while an n-type well is formed in the device region 41B.

On the device region 41A, there is formed a polysilicon gate electrode 43A via a gate insulation film 42A, and a polysilicon gate electrode 43B is formed on the device region 41B via a gate insulation film 42B. Further, n-type diffusion regions 41a and 41b are formed in the device region 41A at both sides of the gate electrode 43A. In the device region 41B, there are formed p-type diffusion regions 41c and 41d at both sides of the gate electrode 43B.

Further, sidewall insulation films 44A are formed at both sidewall surfaces of the gate electrode 43A, and sidewall insulation films 44B are formed at both sidewall surfaces of the gate electrode 43B. Further, in the device region 41A, diffusion regions 41e and 41f of $n^+$-type are formed at respective outer sides of the sidewall insulation films 44A. Similarly, in the device region 41B, diffusion regions 41g and 41h of $n^+$-type are formed at respective outer sides of the sidewall insulation films 44B.

In the present embodiment, the n-channel MOS transistor is formed with a gate length of 1 nm and a gate width of 15 nm. Further, the p-channel MOS transistor is formed with a gate length of 1 nm and a gate width of 15 nm.

In the present embodiment, the gate insulation films 42A and 42B are formed by applying a plasma nitridation processing explained with reference to FIG. 4B to an initial silicon oxide film formed by a wet process with the thickness of 0.8 nm. Thus, the gate insulation films 42A and 42B are formed of an oxynitride film. In the present embodiment, the plasma nitridation processing is conducted at the substrate temperature of 400° C. under the processing pressure of 130 Pa, while supplying an Ar gas with the flow rate of 2000 SCCM and a nitrogen gas with the flow rate of 150 SCCM. Thereby, the plasma power is set to 1.7 W/cm². In this case, the electron temperature becomes 0.8 eV and the resident time of oxygen in the processing space 11A becomes 0.86 seconds.

Figure 16A:
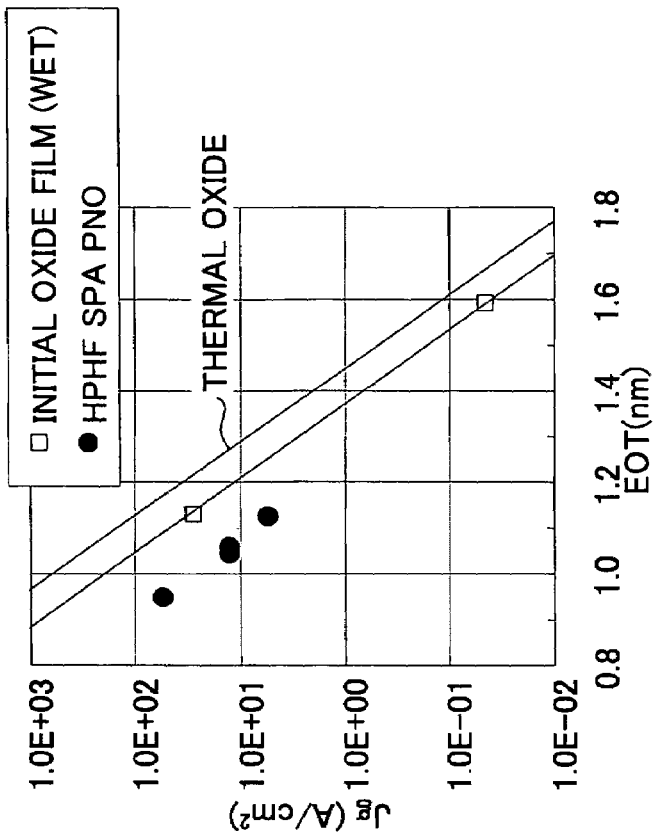
FIGS. 16A and 16B are diagrams showing the relationship between the oxide-film equivalent thickness and leakage current for the gate oxide film respectively for the n-channel MOS transistor and the p-channel MOS transistor constituting the CMOS device of FIG. 15.
Figure 16B:
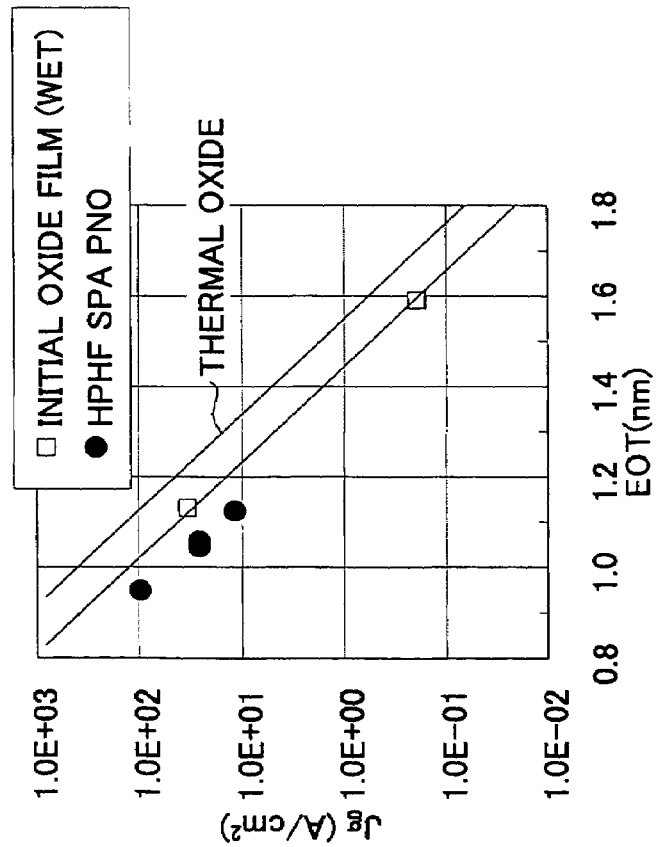

FIGS. 16A and 16B are diagrams showing the relationship (●) between the gate leakage current density and the oxide-film equivalent thickness (EOT) respectively for the n-channel MOS transistor formed in the device region 41A and the p-channel MOS transistor formed in the device region 41B of FIG. 15, wherein the drawings also show the leakage current characteristics of a thermal oxide film (continuous line) and the initial oxide film (□).

Referring to FIGS. 16A and 16B, it can be seen that an oxide-film equivalent thickness of 1.0–1.2 nm is realized in the present embodiment for the gate insulation films 42A and 42b, and that the leakage current density is significantly decreased as compared with the initial oxide film or thermal oxide film having a corresponding physical thickness, in spite of the fact that the oxynitride film of the present embodiment has such a very small oxide-film equivalent thickness.

Figure 17A:
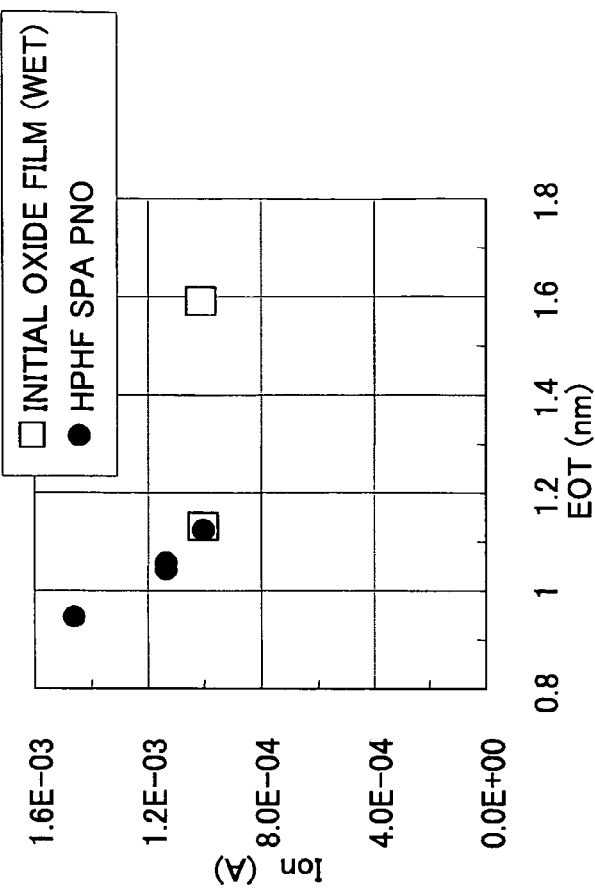
FIGS. 17A and 17B are diagrams showing the relationship between the oxide-film equivalent thickness of the gate insulation film and the ion current respectively for the n-channel MOS transistor and the p-channel MOS transistor constituting the CMOS device of FIG. 15.
Figure 17B:
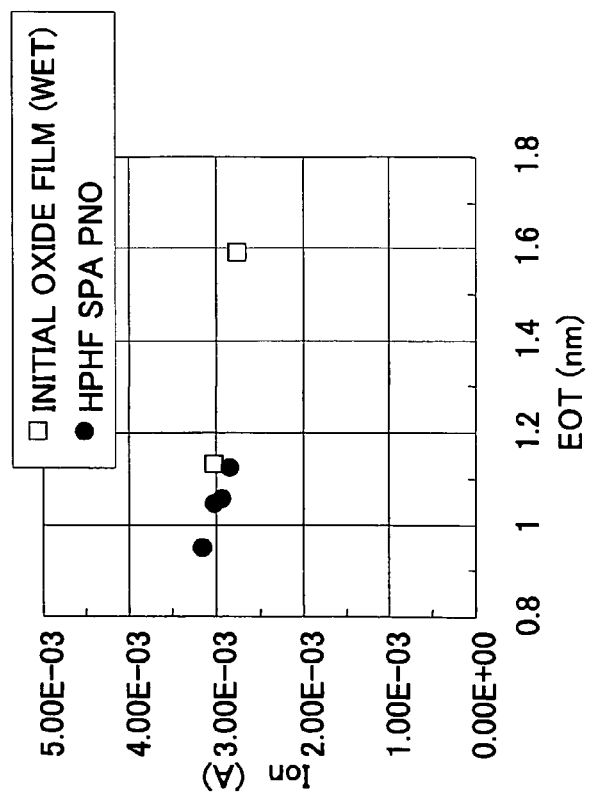

FIGS. 17A and 17B show the relationship between the ON-current and oxide-film equivalent thickness of the gate insulation film respectively for the n-channel MOS transistor formed on the device region 41A and the p-channel MOS transistor formed on the device region 41B of FIG. 15. In the drawings, □ represents the case in which the initial oxide film is used for the gate insulation film as it is, while ● represents the case in which an oxynitride film formed by plasma nitridation of the initial oxide film is used for the gate insulation film 42A or 42B.

Referring to FIGS. 17A and 17B, it can be seen that there is caused no decrease of ON current in the case of the n-channel MOS transistor and that the ON current has been increased in the case of the p-channel MOS transistor.

Figure 18:
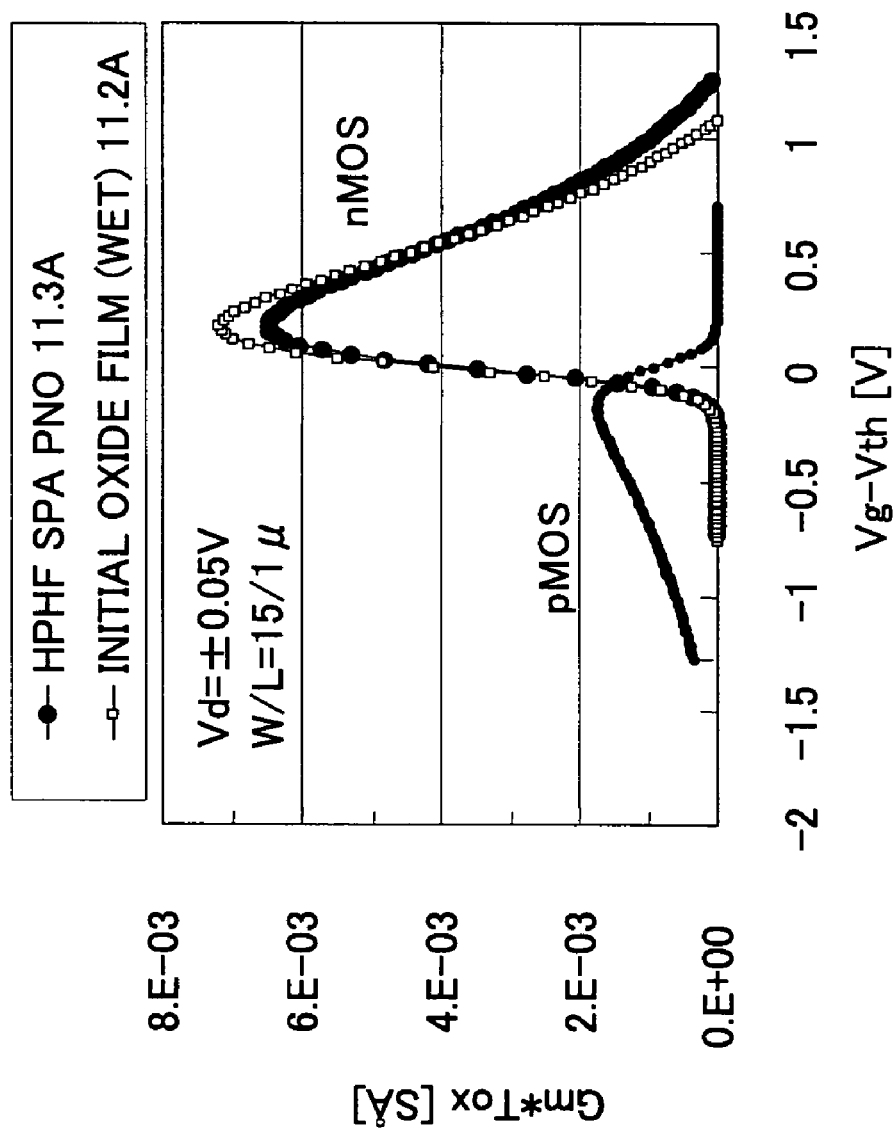
FIG. 18 is a diagram showing the mobility in the n-channel MOS transistor and the p-channel MOS transistor constituting the CMOS device of FIG. 15.

FIG. 18 is a diagram showing the mobility of the n-channel MOS transistor and the p-channel MOS transistor thus obtained. In FIG. 18, □ represents the case in which the initial oxide film is used while ● represents the case in which the oxynitride film is used for the gate insulation films 42A and 42B. In FIG. 18, it should be noted that the vertical axis represents the product of the mutual conductance and the oxide-film equivalent thickness, wherein this value corresponds to the mobility. Further, the horizontal axis represents the quantity in which the threshold voltage Vth is subtracted from the applied gate voltage Vg.

Referring to FIG. 18, it can be seen that the decrease of mobility associated with the use of the oxynitride film formed by the plasma nitridation processing for the gate insulation film 42A of the n-channel MOS transistor is about 5% or less. In the case of the p-channel MOS transistor, on the other hand, it can be seen that there is achieved a significant increase of mobility as a result of use of such an oxynitride film for the gate insulation film 42B. In the case of using the initial oxide film, on the contrary, it should be noted that it was not possible to measure the mobility.

[Twelfth Embodiment]

Figure 19A:
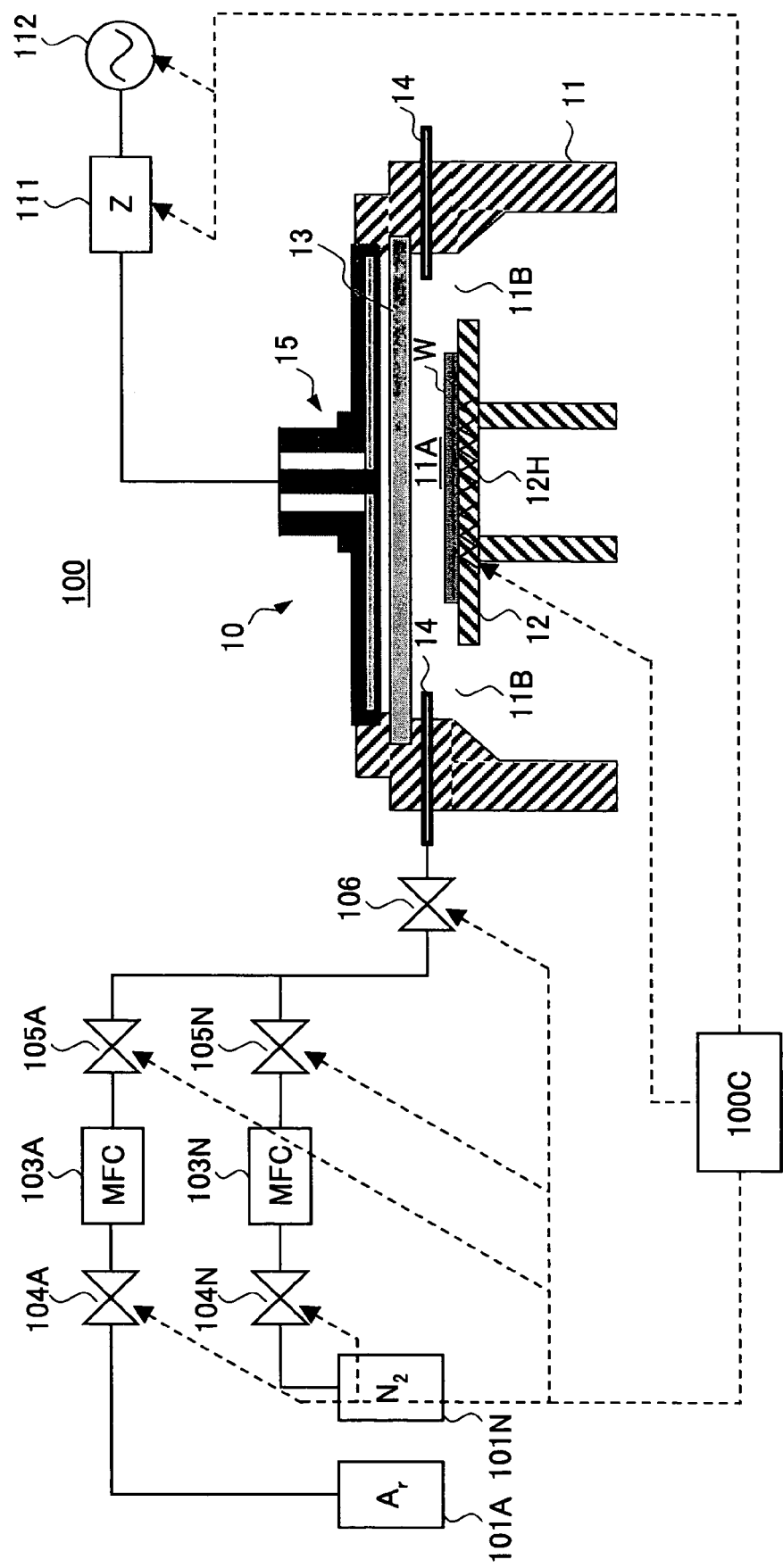
FIGS. 19A and 19B respectively show the overall construction of the substrate processing system including the substrate processing apparatus of FIG. 1 and used with the present invention for substrate processing and the construction of a computer used for controlling the substrate processing system of FIG. 19A.
Figure 19B:
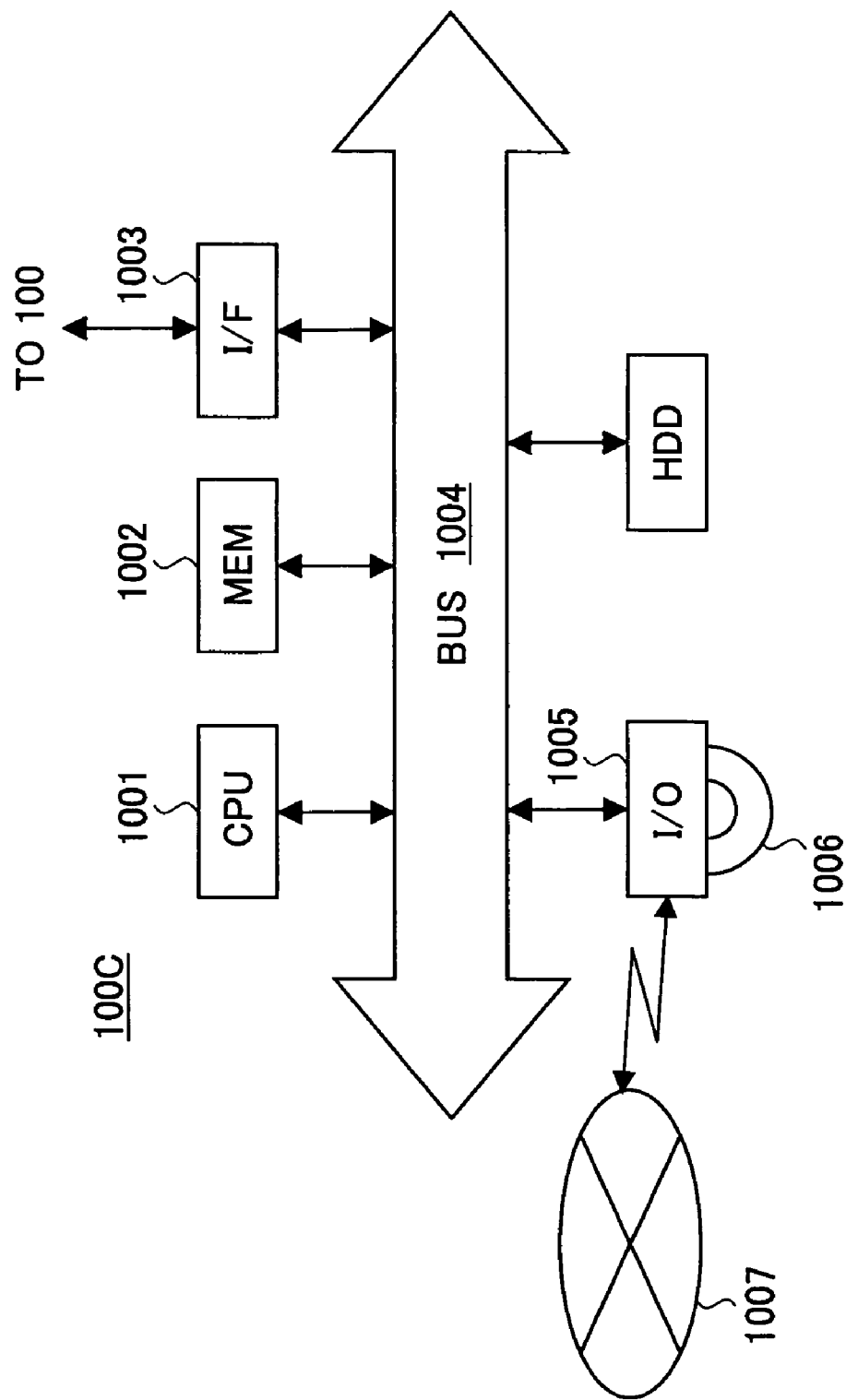

FIG. 19A shows the construction of an overall substrate processing system 100 that includes the substrate processing apparatus 10 of FIG. 1 and used for the nitridation processing of the oxide film of the present invention, while FIG. 19B show a computer used for controlling the substrate processing apparatus 10 of FIG. 1 in the system of FIG. 19A.

Referring to FIG. 19A, the system 100 includes an Ar gas source 101A and a nitrogen gas source 101B wherein the Ar gas source 101A supplies an Ar gas to the gas inlet port 14 of the substrate processing apparatus 10 via a mass flow controller 103A and via valves 104A and 105A and further via a valve 106, while the nitrogen gas source 101B supplies a nitrogen gas to the gas inlet port 14 via a mass flow controller 103N and via valves 104N and 105N and further via the valve 106 coupled to the gas inlet port 14 commonly to the gas supply path of the Ar gas and the gas supply path of the nitrogen gas.

Further, the system 100 includes a microwave power source 112 that supplied the microwave power to the radial line slot antenna 15 via an impedance matcher 111.

Further, a heating mechanism 12H is provided in the stage 12 for temperature control of the substrate W to be processed.

Further, it should be noted that there is provided a system controller 100C that controls the mass flow controllers 103A and 103B, valves 104A, 104N, 105A, 105N and 106, the heating mechanism 12H, and further an evacuation pump not illustrated, according to the program held therein, and the substrate processing apparatus 10 performs the foregoing nitridation processing of the oxide film under control of the controller 100C.

FIG. 19B shows the construction of the controller 100C.

Referring to FIG. 19B, the controller 100C is a general purpose computer and includes a CPU 1001, a memory 1002 holding a program and data, an interface unit 1003 connected to the system 100, and an I/O interface 1005 connected with each other by a system bus 1004, wherein the computer 100C is provided with the control program of the substrate processing system 100 from a recording medium 1006 such as an optical disk or a floppy disk or from a network 1007 and controls the substrate processing system 100 of FIG. 19A including the substrate processing apparatus 10 via the interface unit 1003.

Thus, the present invention also includes such a computer configured by the program code means recorded on a processor-readable medium and also the processor readable medium that carries such a program code.

Further, while the present invention has been explained with reference to preferred embodiments, the present invention is not limited to such specific embodiments but various variations and modifications may be made without departing from the scope of the invention.

According to the present invention, it becomes possible to suppress the plasma damages of the oxynitride film by setting the electron temperature of the microwave plasma to 2 eV or less, preferably 1 eV or less, more preferably 0.9 eV or less. Further, by setting the resident time of oxygen in the processing space to 2 seconds or less, preferably 1 second or less, more preferably 0.86 seconds or less, the oxygen atoms decoupled as a result of nitridation of the oxynitride film are removed promptly from the processing space, and the regrowth of the oxide film caused right underneath the oxynitride film by the decoupled oxygen is suppressed. Further, by conducting the nitridation processing at the temperature of 500° C. or less, the problem of the nitrogen atoms thus introduced cause diffusion to the interface between the oxide film and the silicon substrate and form the defects such as interface states is suppressed.

What is claimed is:

1. A substrate processing method for forming an oxynitride film by nitriding an oxide film formed on a silicon substrate surface, comprising:
    a nitridation processing step, said nitridation processing step exciting a nitrogen gas with plasma and nitriding said oxide film by radicals or ions formed with excitation of said nitrogen gas with said plasma,
    said nitridation processing step causing release of oxygen from said oxide film with said nitridation,
    said nitridation processing step being conducted by setting a resident time of said oxygen in a processing space in which said silicon substrate is held to be 2 seconds or less.

2. The substrate processing method as claimed in claim 1, wherein said plasma is excited by a microwave.

3. The substrate processing method as claimed in claim 1, wherein said nitridation processing is conducted at a substrate temperature of less than 500° C.

4. The substrate processing method as claimed in claim 1, wherein said nitridation processing is conducted by setting an electron temperature of said plasma to be 2 eV or less.

5. The substrate processing method as claimed in claim 1, wherein said nitridation processing step is conducted by setting an electron temperature of said plasma to 1 eV or less.

6. The substrate processing method as claimed in claim 1, wherein said nitridation processing step is conducted by setting an electron temperature of said plasma to 0.9 eV or less.

7. The substrate processing method as claimed in claim 1, wherein said nitridation processing step is conducted by setting said resident time of oxygen in said processing space to 1.78 seconds or less.

8. The substrate processing method as claimed in claim 1, wherein said nitridation processing is conducted by setting said resident time of oxygen in said processing space to 1 second or less.

9. The substrate processing method as claimed in claim 1, wherein said nitridation processing step is conducted by setting said resident time of oxygen in said processing space to 0.86 seconds or less.

10. The substrate processing method as claimed in claim 1, wherein said nitridation processing is conducted at said substrate temperature of 100° C. or more.

11. The substrate processing method as claimed in claim 1, wherein said nitridation processing step is conducted by setting said substrate temperature to a range of 250–400° C.

12. The substrate processing method as claimed in claim 1, wherein said nitridation processing is conducted by setting a processing pressure in a processing space to 110 Pa or more.

13. The substrate processing method as claimed in claim 12, wherein said processing space is defined by said silicon substrate and a microwave window facing thereto, said nitridation processing being conducted by introducing a microwave into said processing space via said microwave window.

14. The substrate processing method as claimed in claim 13, wherein said microwave is supplied from a radial line slot antenna coupled to said microwave window.

15. The substrate processing method as claimed in claim 1, wherein said plasma is formed by supplying a microwave of 1 GHz or more but not exceeding 10 GHz to a mixed gas of a rare gas and nitrogen.

16. The substrate processing method as claimed in claim 15, wherein said rare gas is selected from the group consisting of He, Ar, Kr, Ne and Xe.

17. The substrate processing method as claimed in claim 15, wherein said rare gas is an Ar gas.

* * * * *